(12) United States Patent
Funatsu et al.

(10) Patent No.: US 7,718,342 B2
(45) Date of Patent: May 18, 2010

(54) POLYMERS, RESIST COMPOSITIONS AND PATTERNING PROCESS

(75) Inventors: Kenji Funatsu, Joetsu (JP); Tomohiro Kobayashi, Joetsu (JP); Koji Hasegawa, Joetsu (JP); Tsunehiro Nishi, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 75 days.

(21) Appl. No.: 11/645,751

(22) Filed: Dec. 27, 2006

(65) Prior Publication Data

US 2007/0148594 A1 Jun. 28, 2007

(30) Foreign Application Priority Data

Dec. 27, 2005 (JP) .............................. 2005-374831

(51) Int. Cl.
*G03F 7/039* (2006.01)
*G03F 7/20* (2006.01)
*G03F 7/30* (2006.01)
*G03F 7/38* (2006.01)

(52) U.S. Cl. ............... 430/270.1; 430/325; 430/326; 430/330; 430/910; 430/907; 526/245; 526/246; 526/266; 526/268; 526/270; 526/282; 526/284

(58) Field of Classification Search ........... None
See application file for complete search history.

(56) References Cited

U.S. PATENT DOCUMENTS 6,004,724 A 12/1999 Yamato et al.
(Continued)

FOREIGN PATENT DOCUMENTS

| JP | 9-73173 A | 3/1997 |
|---|---|---|
| JP | 9-90637 A | 4/1997 |

(Continued)

OTHER PUBLICATIONS

Machine assisted English translation of JP 2005-234450 (Iwato) provided by JPO.*

(Continued)

*Primary Examiner*—Sin J. Lee
(74) *Attorney, Agent, or Firm*—Birch, Stewart, Kolasch & Birch, LLP

(57) ABSTRACT

A polymer is provided comprising recurring units having formulas (1), (2), (3), (4), (5), and (6) in amounts of 1-60 mol % (1), 1-60 mol % (2), 1-50 mol % (3), 0-60 mol % (4), 0-30 mol % (5), and 0-30 mol % (6), and having a Mw of 3,000-30,000 and a Mw/Mn of 1.5-2.5. $R^1$, $R^3$, $R^4$, $R^7$, $R^9$, and $R^{11}$ are H or $CH_3$, Y is methylene or O, $R^2$ is $CO_2R^{10}$ when Y is methylene and $R^2$ is H or $CO_2R^{10}$ when Y is O, $R^{10}$ is $C_1$-$C_{15}$ alkyl which may be separated by O, $R^5$ and $R^6$ are H or OH, $R^8$ is a tertiary ester type acid-labile protective group, and $R^{12}$ is OH-containing fluoroalkyl. A resist composition comprising the polymer has a high resolution and is improved in line edge roughness and I/G bias.

15 Claims, No Drawings

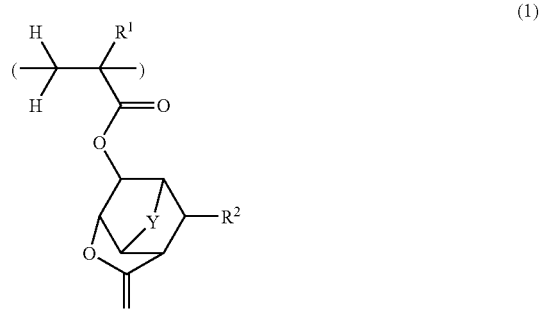

(1)

(2)

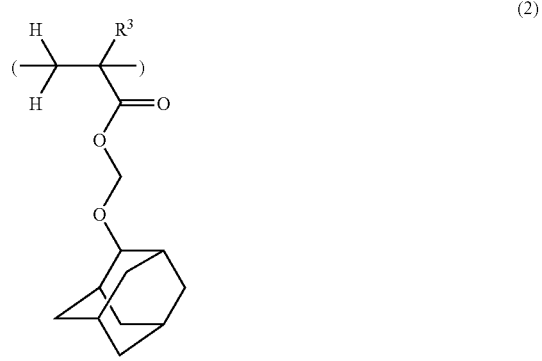

(3)

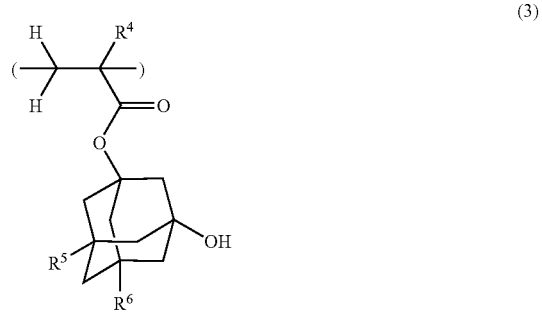

(4)

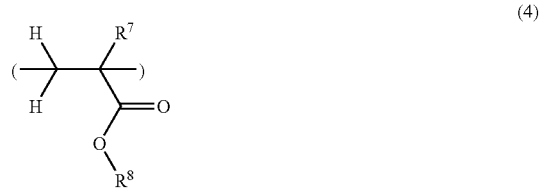

(5)

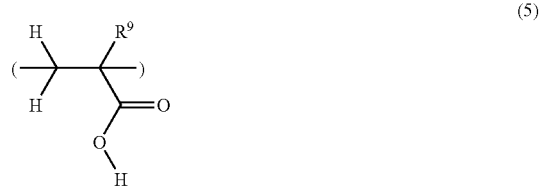

(6)

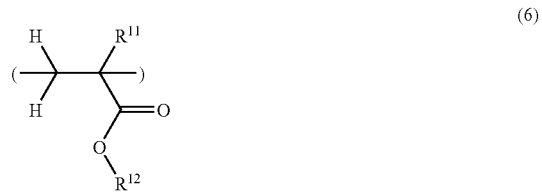

U.S. PATENT DOCUMENTS

| | | |
|---|---|---|
| 6,200,725 B1 | 3/2001 | Takechi et al. |
| 6,261,738 B1 | 7/2001 | Asakura et al. |
| 6,280,898 B1 | 8/2001 | Hasegawa et al. |
| 6,312,867 B1 | 11/2001 | Kinsho et al. |
| 6,329,125 B2 | 12/2001 | Takechi et al. |
| 6,916,591 B2 | 7/2005 | Ohsawa et al. |
| 2005/0227174 A1* | 10/2005 | Hatakeyama et al. .... 430/270.1 |
| 2006/0246377 A1 | 11/2006 | Yamato et al. |
| 2007/0099112 A1* | 5/2007 | Kobayashi et al. ....... 430/270.1 |
| 2007/0099113 A1* | 5/2007 | Kobayashi et al. ....... 430/270.1 |

FOREIGN PATENT DOCUMENTS

| | | |
|---|---|---|
| JP | 9-95479 A | 4/1997 |
| JP | 9-208554 A | 8/1997 |
| JP | 9-230588 A | 9/1997 |
| JP | 9-301948 A | 11/1997 |
| JP | 2906999 B2 | 4/1999 |
| JP | 2000-159758 A | 6/2000 |
| JP | 2000-314956 A | 11/2000 |
| JP | 2000-336121 A | 12/2000 |
| JP | 2002-285161 A | 10/2002 |
| JP | 2004-283788 A | 10/2004 |
| JP | 2005-234449 A | 9/2005 |
| JP | 2005-234450 A | 9/2005 |
| JP | 2005-308044 A | 11/2005 |
| WO | WO-2004/074242 | 9/2004 |
| WO | WO-2005/080473 A1 | 9/2005 |

OTHER PUBLICATIONS

J. Photopolym. Sci. and Tech., 8, pp. 43-44, pp. 45-46 (1995).

J. Photopolym. Sci. and Tech., 9, pp. 29-30 (1996).

* cited by examiner

POLYMERS, RESIST COMPOSITIONS AND PATTERNING PROCESS

CROSS-REFERENCE TO RELATED APPLICATION

This non-provisional application claims priority under 35 U.S.C. §119(a) on Patent Application No. 2005-374831 filed in Japan on Dec. 27, 2005, the entire contents of which are hereby incorporated by reference.

TECHNICAL FIELD

This invention relates to polymers having a specific structure and molecular weight, resist compositions comprising the polymers, adapted for exposure to high-energy radiation with a wavelength of up to 300 nm, and a patterning process using the same.

BACKGROUND OF THE INVENTION

In the recent drive for higher integration and operating speeds in LSI devices, the pattern rule is made drastically finer. Active efforts have been made on the development of micro-processing technology using deep ultraviolet lithography and vacuum ultraviolet lithography. In particular, the ArF excimer laser as a light source of the generation next to the KrF excimer laser is recognized essential to the advanced semiconductor photolithography of 90 to 45-nm node.

One of resist material characteristics required for the photolithography using ArF excimer laser as the light source is a transmittance at wavelength 193 nm. Transparency is indispensable to achieve a high sensitivity and high resolution. For example, the base resins proposed thus far include poly(meth) acrylic acids and derivatives thereof having tertiary ester type acid-labile protective groups as typified by 2-ethyladamantyl and 2-methyladamantyl. They ensure a certain level of etch resistance attributable to a high carbon density of adamantyl group and the transparency of a single resin, achieving some advantages including a high sensitivity and a certain level of resolution. See JP-A 9-73173 and JP-A 9-90637.

However, since acid labile groups as typified by 2-alkyladamantyl have high rigidity and hydrophobicity in themselves, polymers having a large proportion of such compounds incorporated therein become very rigid and hydrophobic overall. This causes swelling of a resist film during development, leading to pattern fusion or collapse and pattern sidewall roughening, known as line edge roughness (LER). These polymers are thus impractical in the lithography because a further pattern rule reduction is needed in the future.

Recently proposed were polymers comprising as constituent units (2-adamantyloxy)-methyl methacrylate, 3-hydroxyadamantyl methacrylate, and a lactone structure-bearing methacrylate such as γ-butyrolactone methacrylate or norbornane lactone methacrylate (see WO 2005080473). They have a good sensitivity even when a weak acid is generated from the acid generator, succeeding in acquiring relatively good resist characteristics.

However, resins comprising norbornane lactone methacrylate have an increased LER due to swelling. Resins comprising γ-butyrolactone methacrylate have an increased acid diffusion and an increased size difference between isolated and grouped patterns (known as I/G bias). These resins are thus impractical in the lithography because a further pattern rule reduction is needed in the future.

It is confirmed that polymers comprising as constituent units adamantylmethoxymethyl methacrylate, 3,3'-dihydroxyadamantyl methacrylate, and a lactone structure-bearing methacrylate such as oxanorbornane lactone methacrylate or 9-methoxycarbonyl-4-oxatricyclo[4.2.1.0$^{3,7}$]nonan-5-on-2-yl methacrylate are certainly superior in process margin and exposure margin (see JP-A 2005-234449). However, since the effects for 3,3'-dihydroxyadamantyl methacrylate to impart certain rigidity to resin and restrain acid diffusion are offset by the effect for adamantylmethoxymethyl methacrylate to promote acid diffusion due to its side chain flexibility, it is difficult to suppress the I/G bias. These resins are thus impractical.

It is also confirmed that polymers comprising (1-adamantyloxy)methyl methacrylate and oxanorbornane lactone methacrylate are certainly superior in process margin and exposure margin (see JP-A 2005-234450). Since they lack 3-hydroxyadamantyl methacrylate and 3,3'-dihydroxyadamantyl methacrylate as found in the foregoing polymers, they fail to hold down acid diffusion by introducing a hydroxyadamantane structure as typified by 3-hydroxyadamantyl methacrylate and 3,3'-dihydroxyadamantyl methacrylate for imparting a certain rigidity to resins. In addition, these resins have a lower carbon density and hence, lower etch resistance and are thus impractical.

In summary, not only resolution and etch resistance are required, but it is also required to restrain line edge roughness (LER) and size difference between isolated and grouped patterns (I/G bias). The above problems become serious particularly at sizes less than the KrF exposure wavelength of 248 nm. Holding down acid diffusion is an effective method for reducing the I/G bias. However, minimizing acid diffusion gives rise to problems including the asperity of pattern sidewalls by standing waves and an increased LER. It is thus a difficult task to find a compromise between LER and I/G bias improvements. Enhancing the contrast of exposure dose dependence of a dissolution rate of resist film in developer (i.e., dissolution contrast) is effective not only for resolution, but also for LER improvement. In order to meet both minimal LER and minimal I/G bias while maintaining a high resolution, it is desired to have a resist material having a reduced acid diffusion length and a high dissolution contrast.

DISCLOSURE OF THE INVENTION

An object of the present invention is to provide a polymer useful in formulating a resist composition for forming at a high resolution a pattern with minimal LER and minimal I/G bias, a resist composition comprising the polymer, and a patterning process using the resist composition.

The inventor has found that a resist composition comprising a polymer having a specific structure and molecular weight possesses a high resolution and is effective in improving LER and I/G bias.

More specifically, the inventor has found that a polymer comprising recurring units having the general formulas (1), (2), (3), (4), (5), and (6), shown below, in amounts of 1 to 60 mol % of units (1), 1 to 60 mol % of units (2), 1 to 50 mol % of units (3), 0 to 60 mol % of units (4), 0 to 30 mol % of units (5), and 0 to 30 mol % of units (6), and having a weight average molecular weight of 3,000 to 30,000 and a dispersity of 1.5 to 2.5 is useful as a base resin in a resist composition; and that a resist composition comprising the polymer possesses a high resolution and is effective in improving LER and I/G bias, and the polymer is quite effective as a resist material for precise micropatterning. This is because the polymer has a high dissolution contrast and the acid diffusion length in the polymer is reduced.

Accordingly, the present invention provides a polymer, a resist composition, and a patterning process, as defined below.

In one aspect, the invention provides a polymer comprising recurring units having the general formulas (1), (2), (3), (4), (5), and (6), shown below, in amounts of 1 to 60 mol % of units (1), 1 to 60 mol % of units (2), 1 to 50 mol % of units (3), 0 to 60 mol % of units (4), 0 to 30 mol % of units (5), and 0 to 30 mol % of units (6), the polymer having a weight average molecular weight of 3,000 to 30,000 and a dispersity of 1.5 to 2.5.

(1)
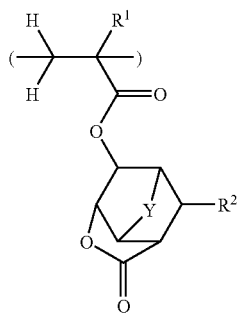

(2)
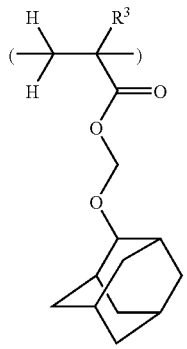

(3)
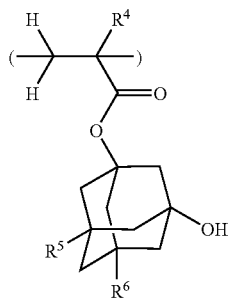

(4)
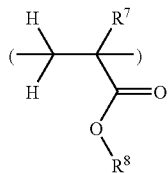

(5)
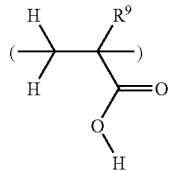

(6)
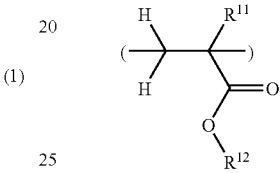

Herein $R^1$, $R^3$, $R^4$, $R^7$, $R^9$, and $R^{11}$ are each independently hydrogen or methyl, Y is methylene or an oxygen atom, $R^2$ is $CO_2R^{10}$ when Y is methylene and $R^2$ is hydrogen or $CO_2R^{10}$ when Y is an oxygen atom, $R^{10}$ is a straight, branched or cyclic alkyl group of 1 to 15 carbon atoms or a similar alkyl group in which at least one oxygen atom intervenes in an arbitrary carbon-to-carbon bond thereof, $R^5$ and $R^6$ are each independently hydrogen or a hydroxyl group, $R^8$ is a tertiary ester type acid-labile protective group selected from the general formulas ($R^8$-1) and ($R^8$-2), shown below, $R^{12}$ is a fluoroalkyl group containing a hydroxyl group and in which some or all hydrogen atoms on an alkyl group are substituted by fluorine atoms, which may have an oxygen-containing functional group substituted thereon and/or in which an oxygen atom may intervene in an arbitrary carbon-to-carbon bond thereof,

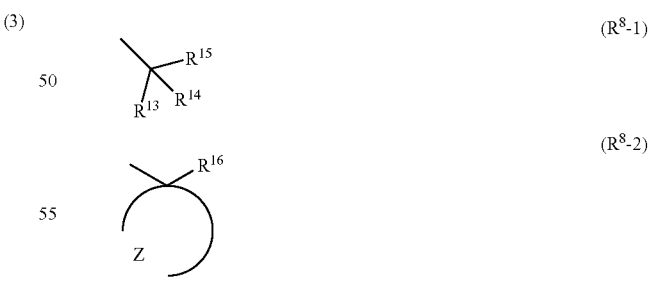

wherein $R^{13}$, $R^{14}$, and $R^{15}$ are each independently a straight, branched or cyclic alkyl group of 1 to 15 carbon atoms, $R^{16}$ is a straight or branched alkyl group of 1 to 15 carbon atoms, and Z is an atomic grouping which forms cyclopentane, cyclohexane, adamantane, norbornane, tricyclo[5.2.1.0$^{2,6}$]decane or tetracyclo[4.4.0.1$^{2,5}$.1$^{7,10}$]-dodecane or a derivative thereof with the carbon atom to which it is bonded.

In a preferred embodiment, the recurring units of formula (1) have the formula (1-1) or (1-2):

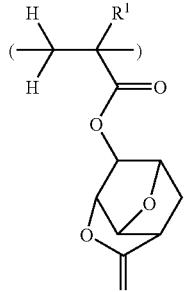
(1-1)

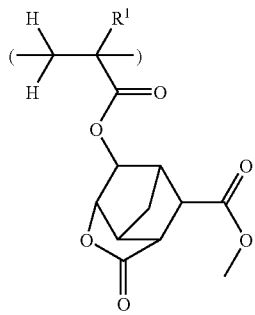
(1-2)

wherein $R^1$ is hydrogen or methyl. In a preferred embodiment, the polymer has a weight average molecular weight of 4,000 to less than 8,000 and a dispersity of 1.5 to 2.3.

In another aspect, the invention provides a resist composition comprising the polymer defined above.

In a further aspect, the invention provides a process for forming a pattern comprising the steps of applying the resist composition onto a substrate to form a coating, heat treating the coating, exposing the coating to high-energy radiation or electron beam through a photomask, heat treating the exposed coating and developing it with a developer.

BENEFITS OF THE INVENTION

The resist composition comprising the inventive polymer as a base resin possesses a high resolution and is improved in line edge roughness (LER) and I/G bias.

DESCRIPTION OF THE PREFERRED EMBODIMENTS

The terms "a" and "an" herein do not denote a limitation of quantity, but rather denote the presence of at least one of the referenced item.

The notation (Cn-Cm) means a group containing from n to m carbon atoms per group.

Polymer

The novel polymer or high-molecular-weight compound of the invention is defined as comprising recurring units having the general formulas (1), (2), (3), (4), (5), and (6), shown below, in amounts of 1 to 60 mol % of units (1), 1 to 60 mol % of units (2), 1 to 50 mol % of units (3), 0 to 60 mol % of units (4), 0 to 30 mol % of units (5), and 0 to 30 mol % of units (6), the polymer having a weight average molecular weight of 3,000 to 30,000 and a dispersity of 1.5 to 2.5.

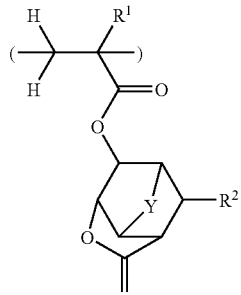
(1)

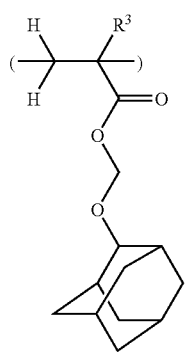
(2)

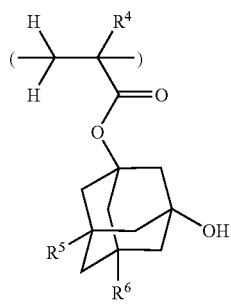
(3)

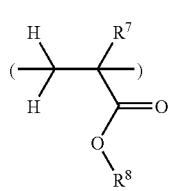
(4)

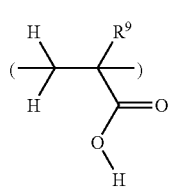
(5)

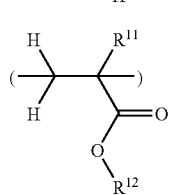
(6)

Herein $R^1$, $R^3$, $R^4$, $R^7$, $R^9$, and $R^{11}$ are each independently hydrogen or methyl.

Y is methylene or an oxygen atom. $R^2$ is $CO_2R^{10}$ when Y is methylene, and $R^2$ is hydrogen or $CO_2R^{10}$ when Y is an oxygen atom. R¹⁰ is a straight, branched or cyclic $C_1$-$C_{15}$ alkyl group or a similar alkyl group in which at least one oxygen atom intervenes in an arbitrary carbon-to-carbon bond thereof. Illustrative examples of $R^{10}$ include, but are not limited to, methyl, ethyl, propyl, isopropyl, n-butyl, sec-butyl, tert-butyl, tert-amyl, n-pentyl, n-hexyl, cyclopentyl, and cyclohexyl. Examples of the alkyl group in which at least one oxygen atom intervenes in an arbitrary carbon-to-carbon bond thereof include, but are not limited to, methoxymethyl, methoxyethoxymethyl, 1-ethoxyethyl, 2-tetrahydrofuranyl, and 2-tetrahydropyranyl.

$R^5$ and $R^6$ are each independently hydrogen or a hydroxyl group.

$R^8$ is a tertiary ester type acid-labile protective group selected from the following general formulas ($R^8$-1) and ($R^8$-2).

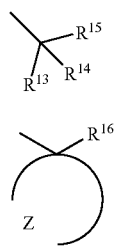

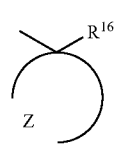

Herein $R^{13}$, $R^{14}$, and $R^{15}$ are each independently a straight, branched or cyclic $C_1$-$C_{15}$ alkyl group, examples of which include methyl, ethyl, propyl, isopropyl, n-butyl, sec-butyl, tert-butyl, tert-amyl, n-pentyl, n-hexyl, cyclopentyl, cyclohexyl, 1-norbornyl, 2-norbornyl, 1-adamantyl, and 2-adamantyl. $R^{16}$ is a straight or branched $C_1$-$C_{15}$ alkyl group, examples of which include methyl, ethyl, propyl, isopropyl, n-butyl, sec-butyl, tert-butyl, tert-amyl, n-pentyl, n-hexyl, cyclopentyl, and cyclohexyl.

Z is an atomic grouping which forms cyclopentane, cyclohexane, adamantane, norbornane, tricyclo[5.2.1.0²,⁶]decane or tetracyclo[4.4.0.1²,⁵.1⁷,¹⁰]dodecane or a derivative thereof with the carbon atom to which it is bonded.

$R^{12}$ is a fluoroalkyl group containing a hydroxyl group and in which some or all hydrogen atoms on an alkyl group are substituted by fluorine atoms, which may have an oxygen-containing functional group substituted thereon and/or in which an oxygen atom may intervene in an arbitrary carbon-to-carbon bond thereof.

Illustrative examples of the recurring units of formula (1) are given below although the invention is not limited thereto.

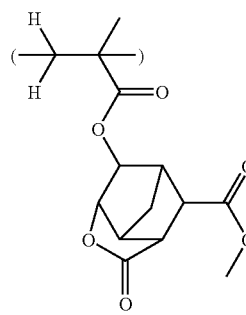

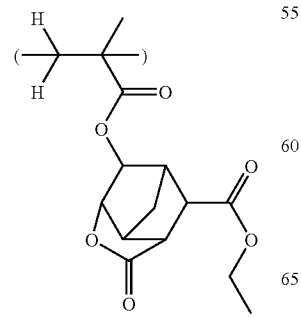

-continued

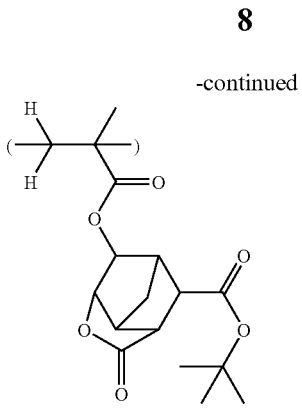

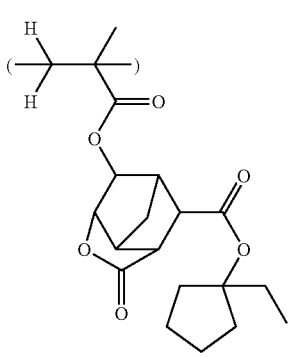

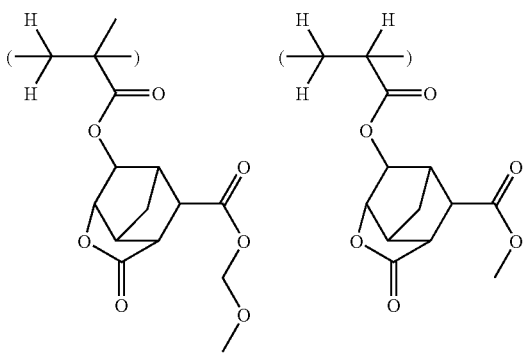

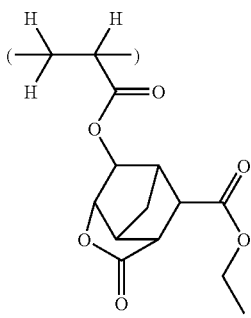

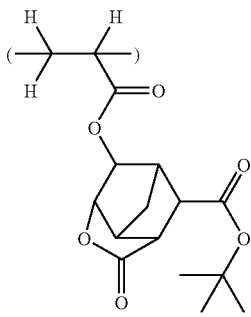

-continued
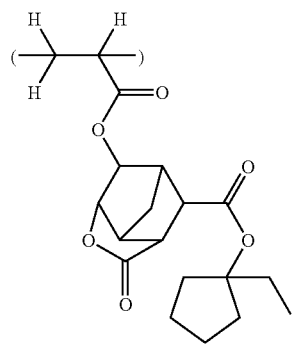
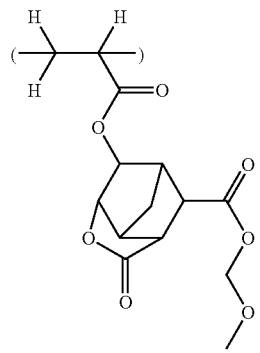
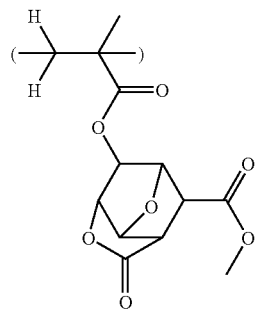
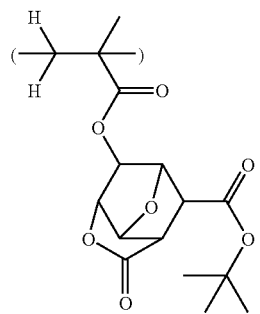
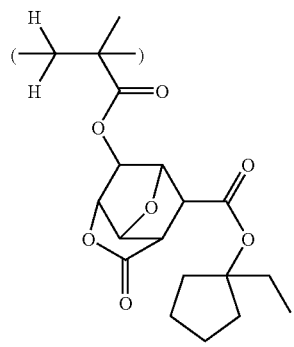
-continued
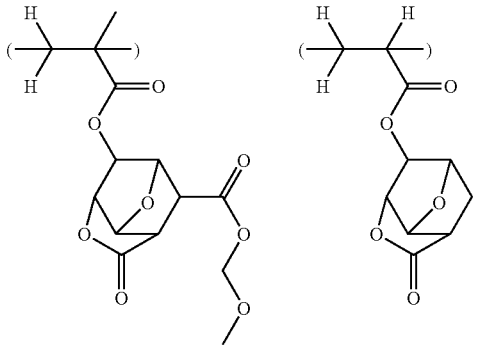
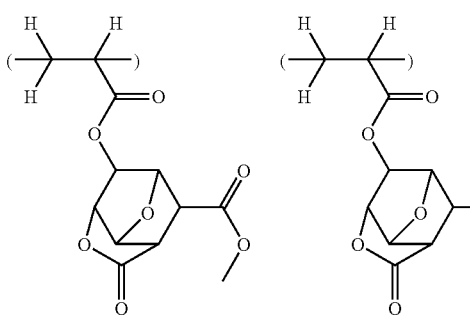
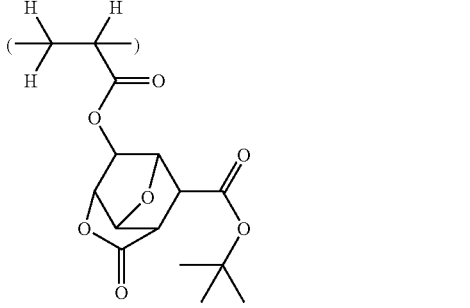
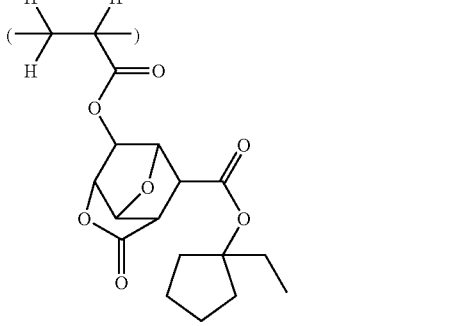
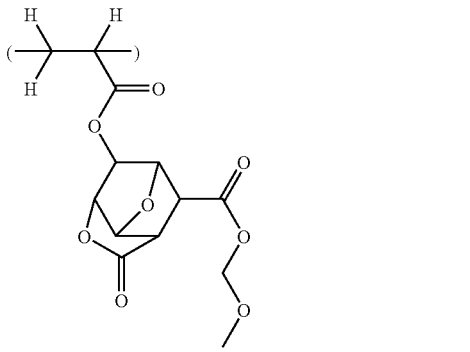

Of these, those units of the following formula (1-1) or (1-2) are preferred.

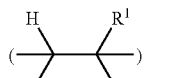

(1-1)

(1-2)

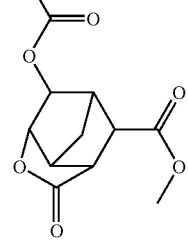

Note that $R^1$ is hydrogen or methyl.

Illustrative examples of the recurring units of formula (2) are given below although the invention is not limited thereto.

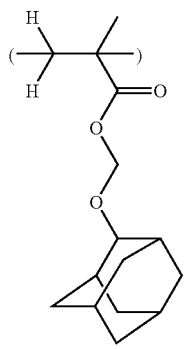
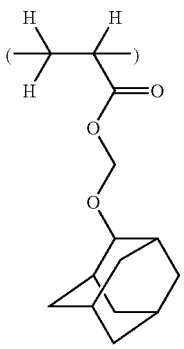

Illustrative examples of the recurring units of formula (3) are given below although the invention is not limited thereto.

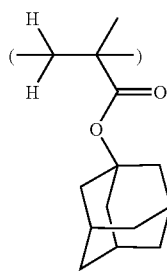
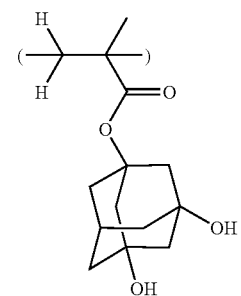

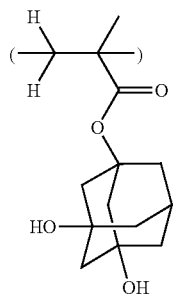
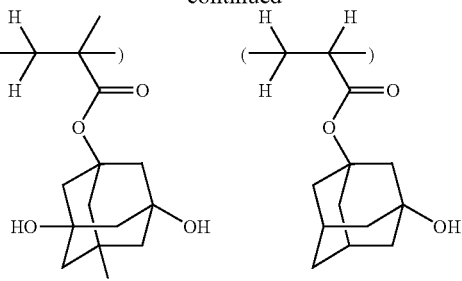

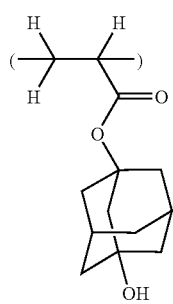
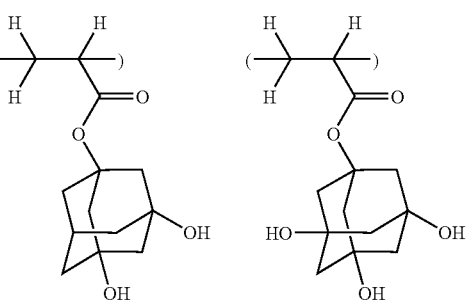

Illustrative examples of the recurring units of formula (4) wherein $R^8$ is ($R^8$-1) are given below although the invention is not limited thereto.

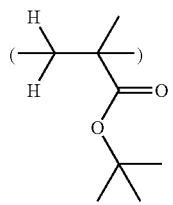
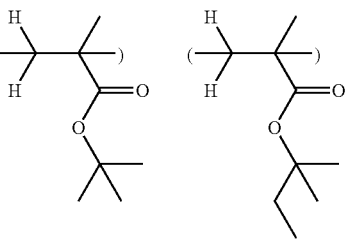

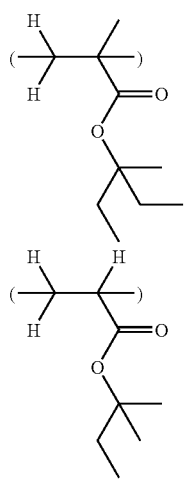
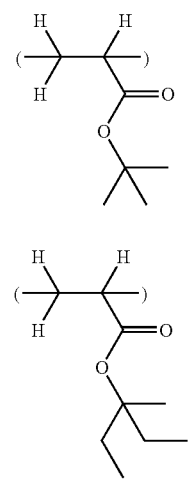

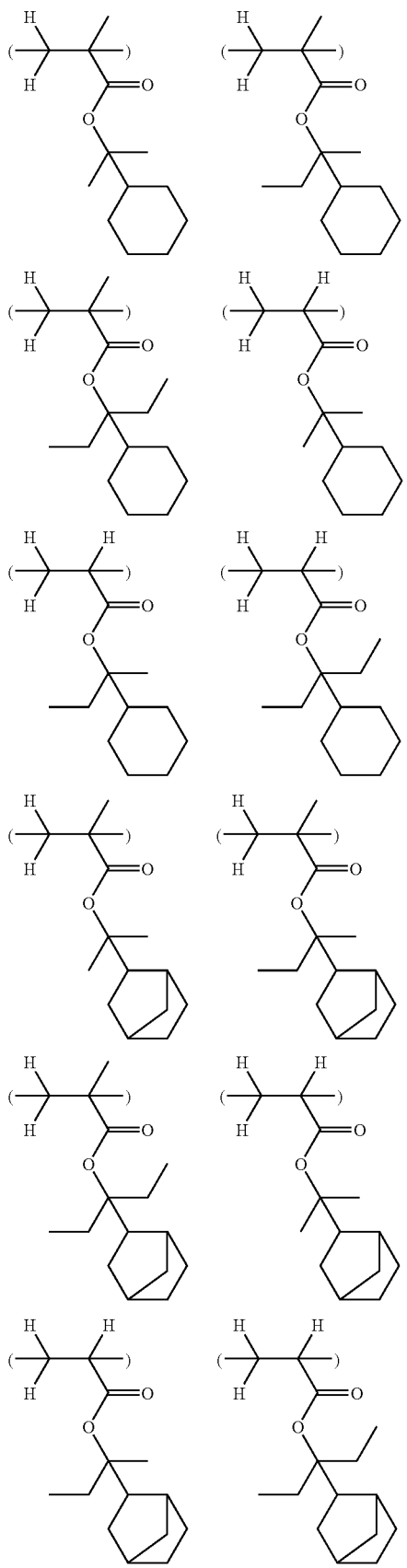

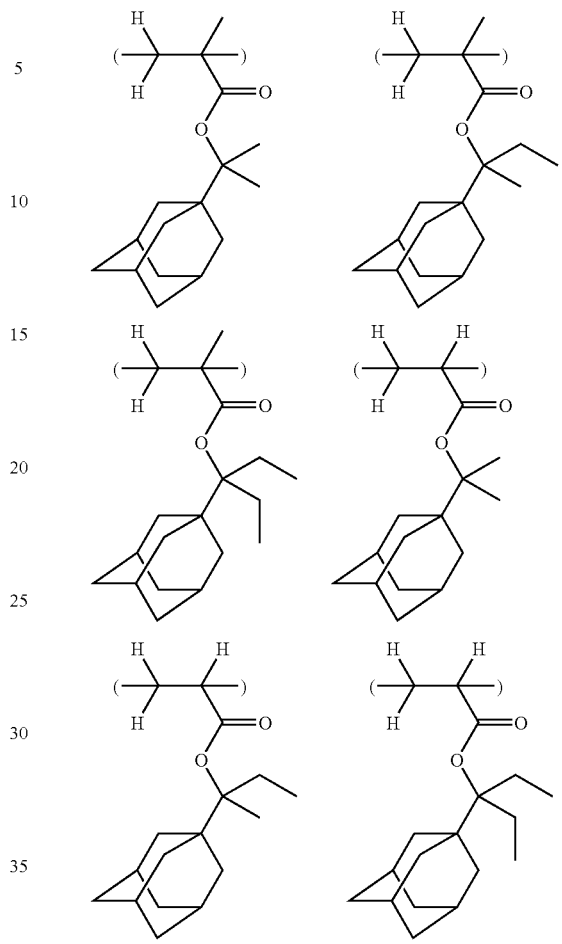

Illustrative examples of the recurring units of formula (4) wherein $R^8$ is ($R^8$-2) are given below although the invention is not limited thereto.

Herein, when Z in ($R^8$-2) in formula (4) is a tertiary exo-alkyl group having a bicyclo[2.2.1]heptane skeleton of norbornane, tricyclo[5.2.1.0$^{2,6}$]decane or tetracyclo[4.4.0.1$^{2,5}$.1$^{7,10}$]dodecane, illustrative of ($R^8$-2) are the following general formulas ($R^8$-2-1) to ($R^8$-2-3). $R^{16}$ is as defined above. In formulas, the broken line denotes a bond site and bond direction.

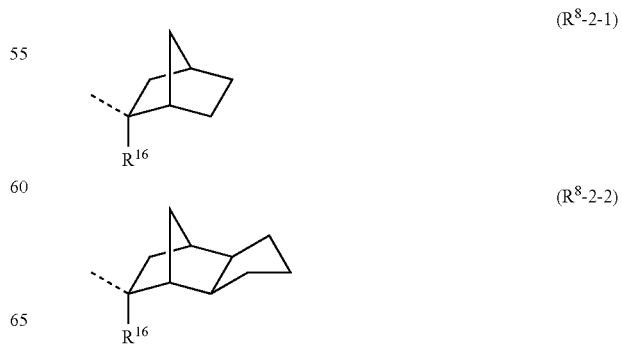

-continued

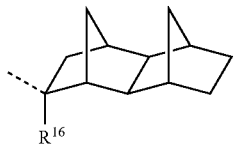
(R⁸-2-3)

Herein, the formula (R⁸-2-2) is representative of one or a mixture of groups having the following general formulas (R⁸-2-2-1) and (R⁸-2-2-2).

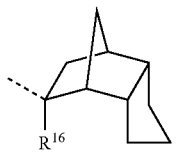
(R⁸-2-2-1)

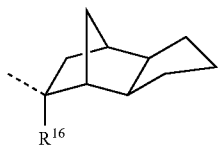
(R⁸-2-2-2)

In formulas, the broken line denotes a bond site and bond direction. R¹⁶ is as defined above.

Also the formula (R⁸-2-3) is representative of one or a mixture of groups having the following general formulas (R⁸-2-3-1) to (R⁸-2-3-4).

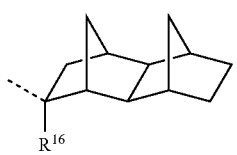
(R⁸-2-3-1)

(R⁸-2-3-2)

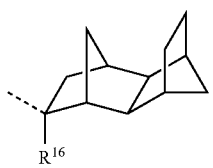
(R⁸-2-3-3)

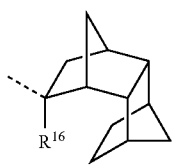
(R⁸-2-3-4)

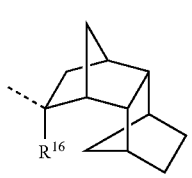

In formulas, the broken line denotes a bond site and bond direction. R¹⁶ is as defined above.

Each of formulas (R⁸-2-1) to (R⁸-2-3), (R⁸-2-2-1) and (R⁸-2-2-2), and (R⁸-2-3-1) to (R⁸-2-3-4) collectively represents an enantiomer thereof and a mixture of enantiomers.

It is noted that in the above formulas (R⁸-2-1) to (R⁸-2-3), (R⁸-2-2-1) and (R⁸-2-2-2), and (R⁸-2-3-1) to (R⁸-2-3-4), the bond direction is on the exo side relative to the bicyclo[2.2.1]heptane ring, which ensures high reactivity for acid catalyzed elimination reaction (see JP-A 2000-336121). In preparing these monomers having a tertiary exo-alkyl group of bicyclo[2.2.1]heptane skeleton as a substituent group, there may be contained monomers substituted with an endo-alkyl group as represented by the following formulas (R⁸-2-1-endo) to (R⁸-2-3-endo). For good reactivity, an exo proportion of at least 50 mol % is preferred, with an exo proportion of at least 80 mol % being more preferred.

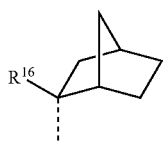
(R⁸-2-1-endo)

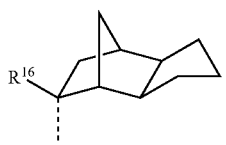
(R⁸-2-2-endo)

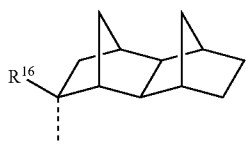
(R⁸-2-3-endo)

In formulas, the broken line denotes a bond site and bond direction. R¹⁶ is as defined above.

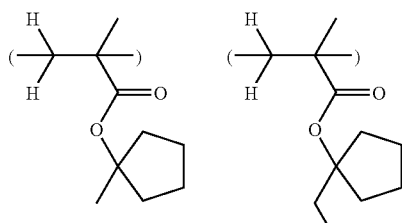

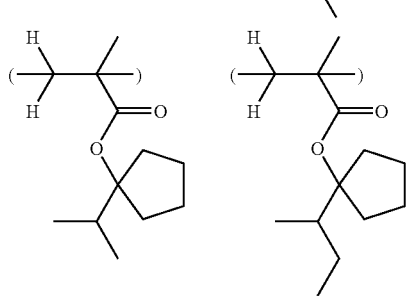

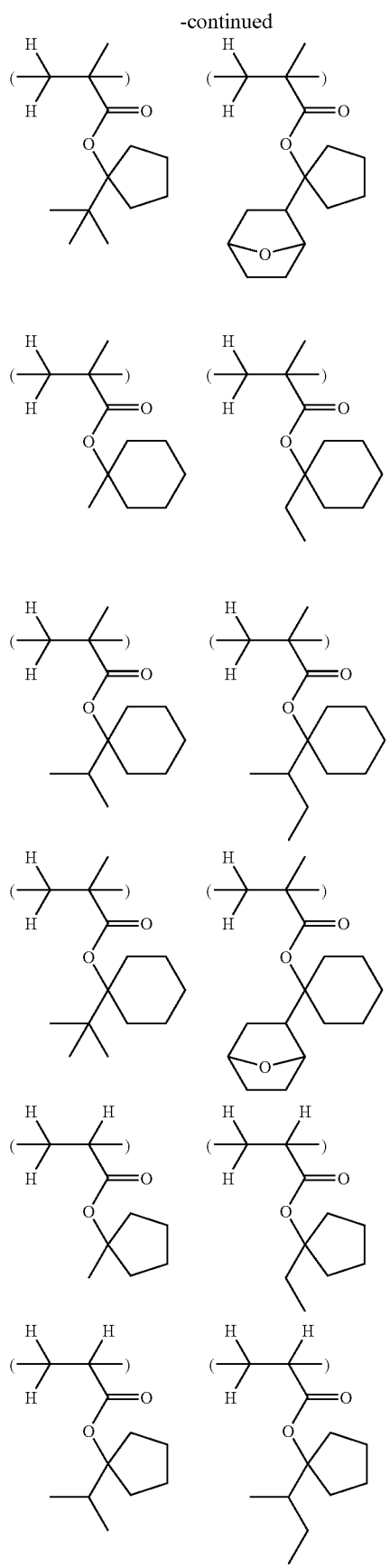
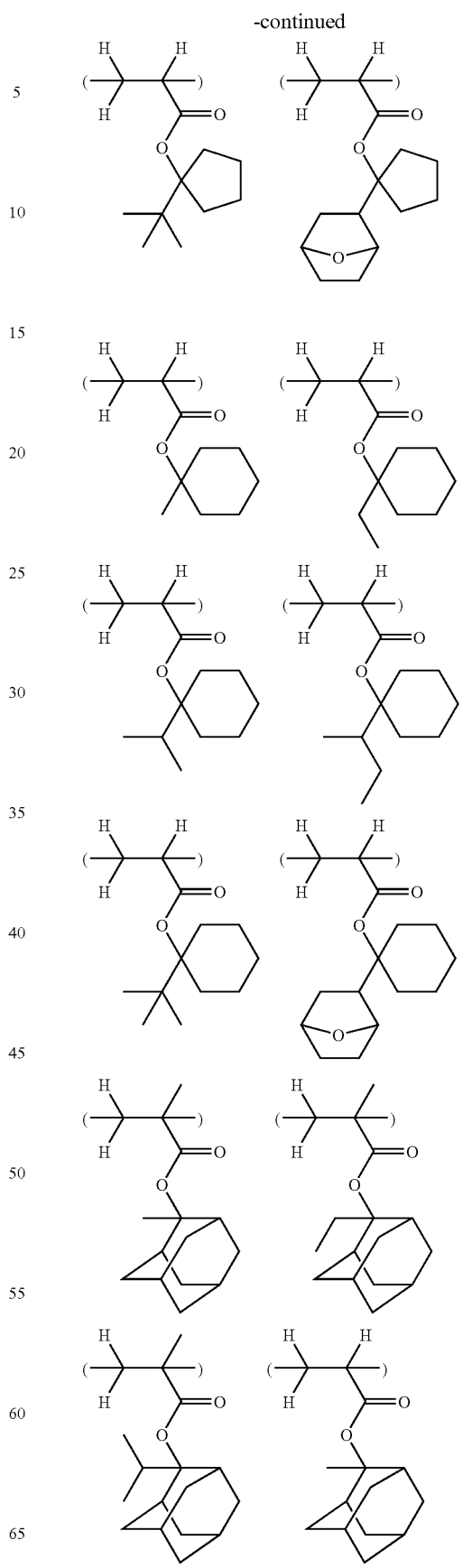

-continued
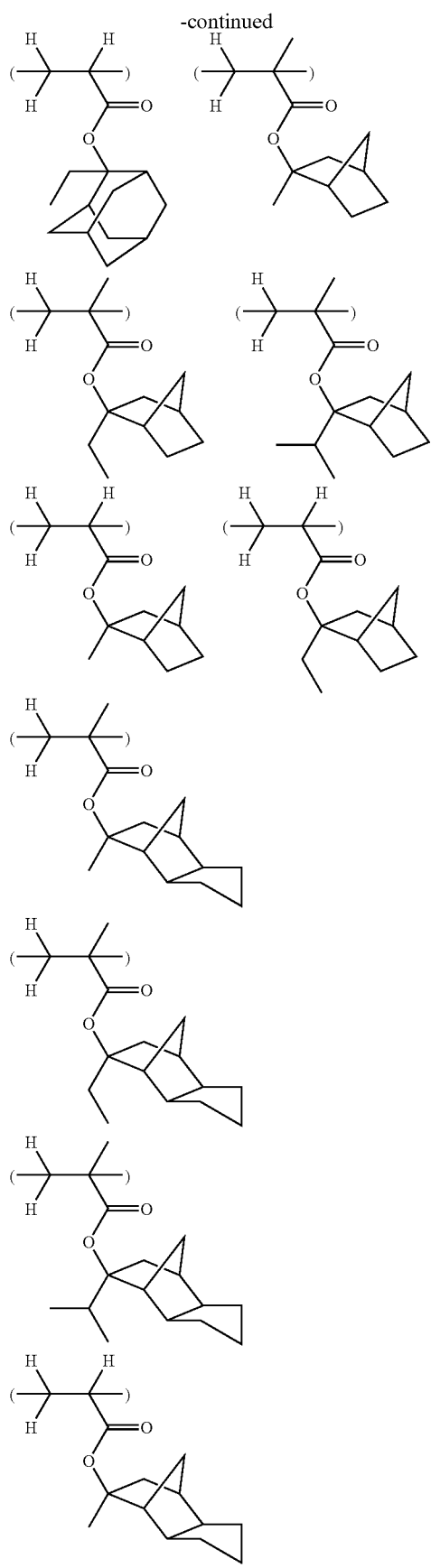
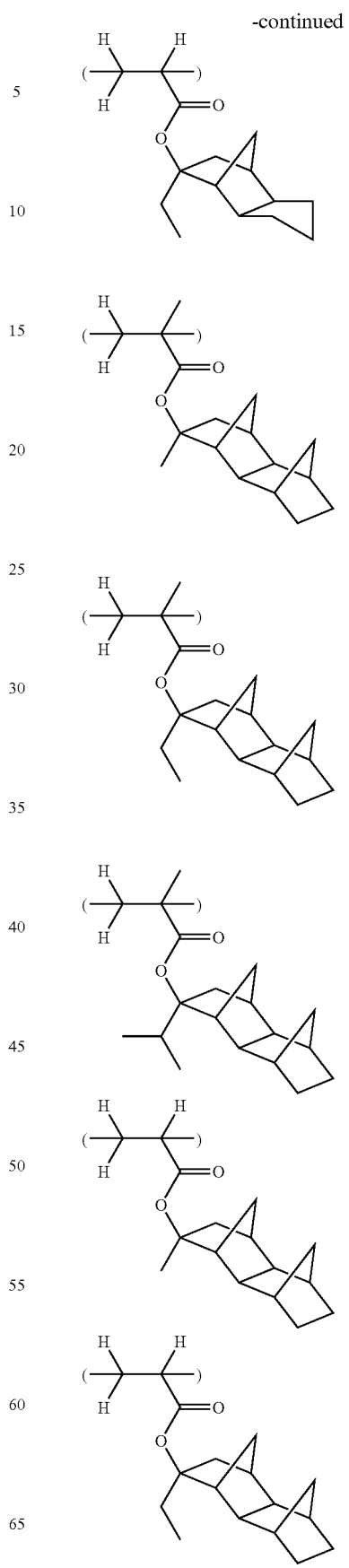

Illustrative examples of the recurring units of formula (5) are given below although the invention is not limited thereto.
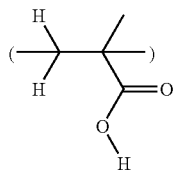 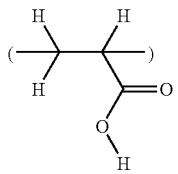
Illustrative examples of the recurring units of formula (6) are given below although the invention is not limited thereto.
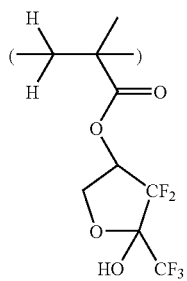 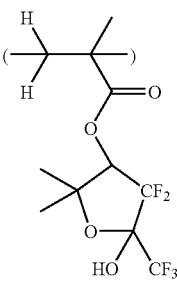
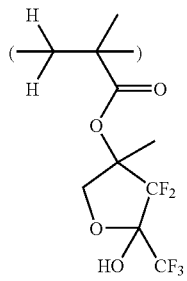 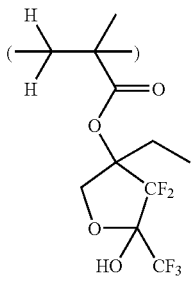
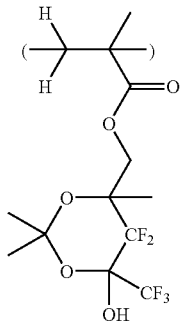 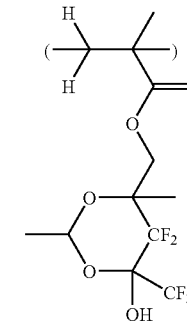
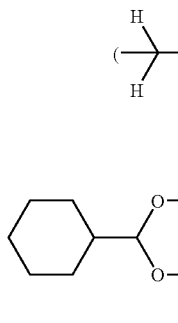
-continued
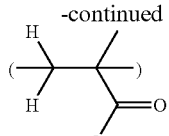 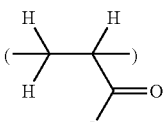
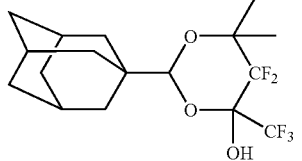 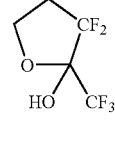
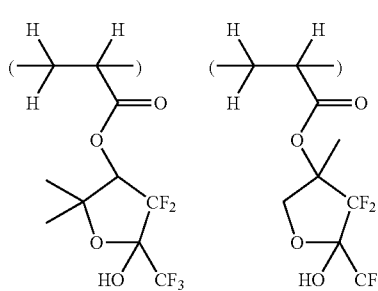
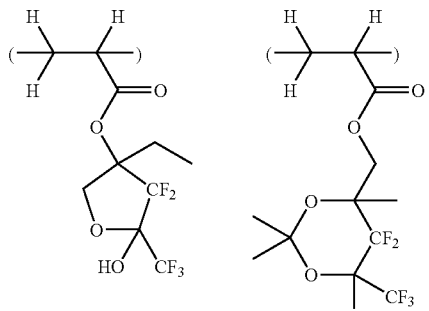
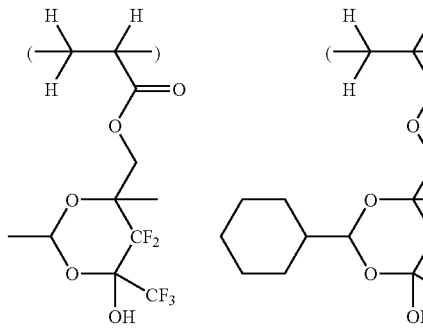
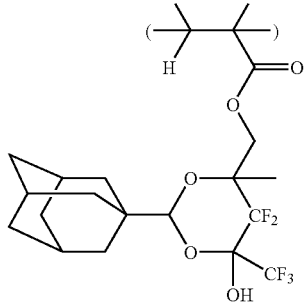

-continued
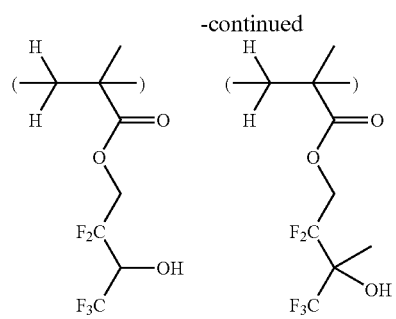
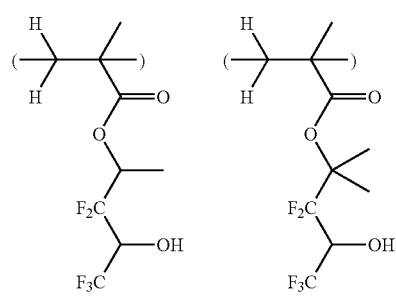
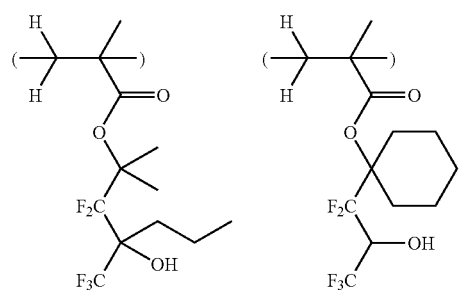
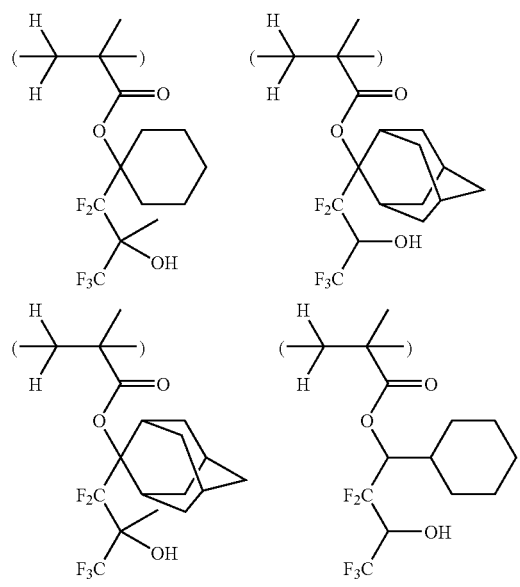
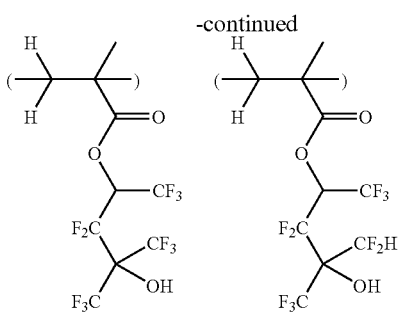
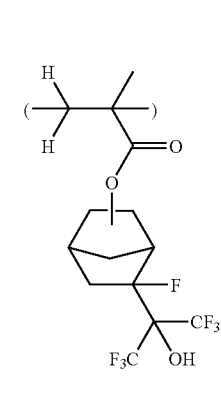
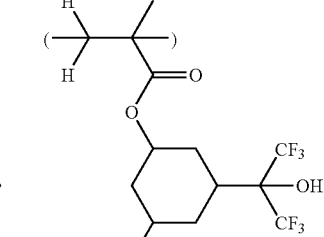
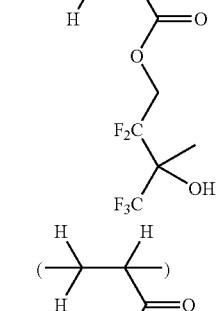
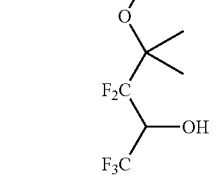

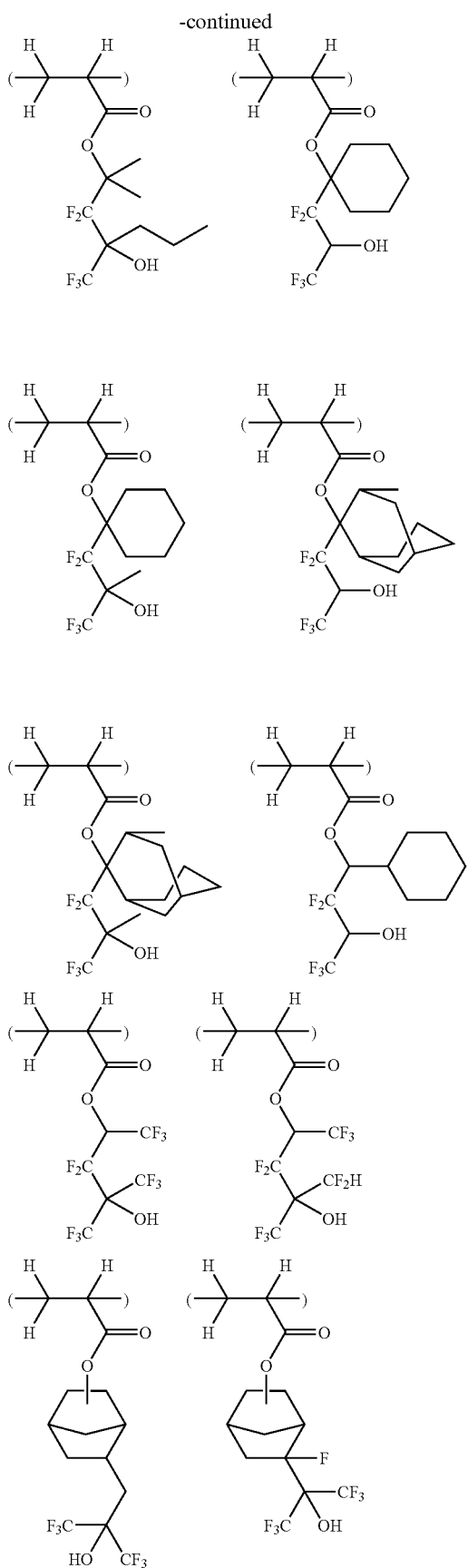

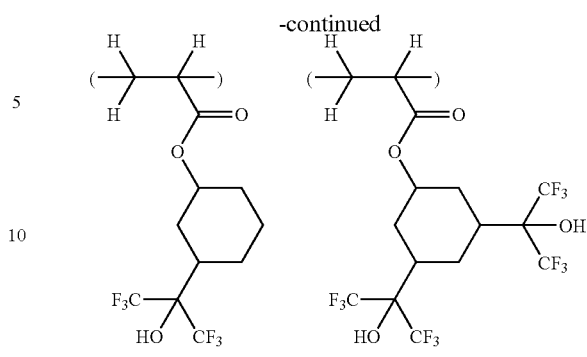

Performing copolymerization while suitably adjusting recurring units of formulas (5) and (6) imparts an appropriate dissolution of a resist film in a developer and contributes to a lowering of LER.

The polymers of the invention should have a weight average molecular weight (Mw) of 3,000 to 30,000, and preferably 4,000 to less than 8,000, as measured by gel permeation chromatography (GPC) using polystyrene standards, and a dispersity (or polydispersity index=Mw/Mn) of 1.5 to 2.5, and preferably 1.5 to 2.3. Outside the ranges, there may result an extreme drop of etch resistance, a reduction of the contrast of exposure dose dependence of a dissolution rate of resist film in developer (i.e., dissolution contrast), a drop of resolution, and degradation of LER.

The polymer of the invention is prepared through copolymerization reaction using compounds of the following general formulas (1a), (2a) and (3a) as first, second and third monomers, optionally a compound of the following general formula (4a) as a fourth monomer, further optionally a compound of the following general formula (5a) as a fifth monomer, and still further optionally a compound of the following general formula (6a) as a sixth monomer.

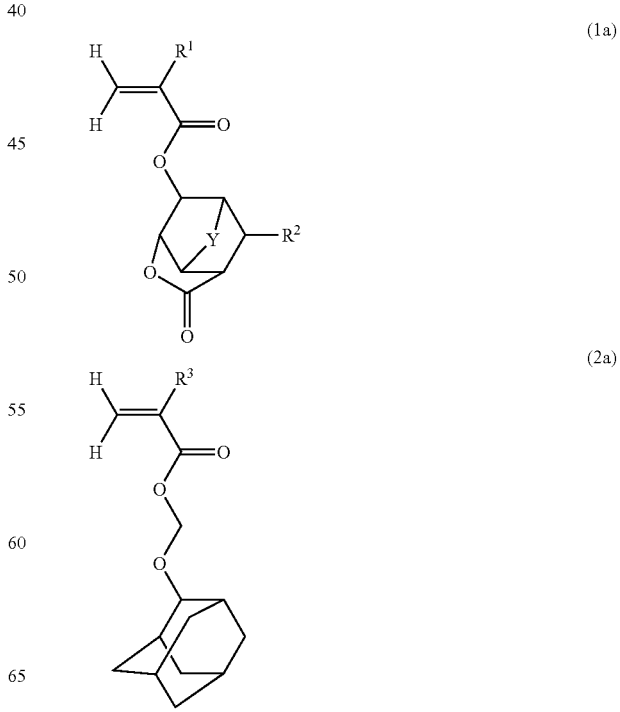

-continued

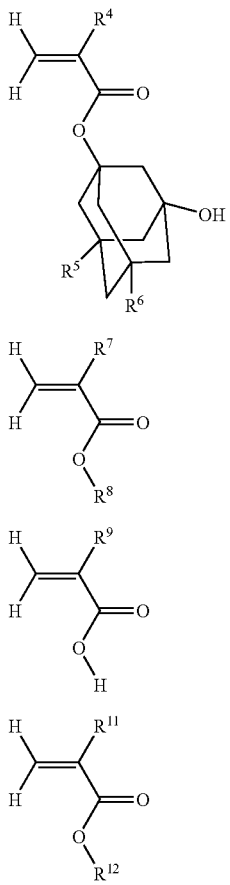

In the above formulas, $R^1$ to $R^9$, $R^{11}$, $R^{12}$ and Y are as defined above.

A polymer capable of exerting better performance as a resist material may be obtained by adjusting a proportion of the respective monomers as appropriate during the copolymerization reaction.

In addition to (i) monomers of formulas (1a), (2a) and (3a), (ii) a monomer of formula (4a), (iii) a monomer of formula (5a), and (iv) a monomer of formula (6a), the polymer of the invention may have further copolymerized therein (v) a monomer having a carbon-to-carbon double bond other than the above (i) to (iv), for example, substituted acrylates such as methyl methacrylate, methyl chrotonate, dimethyl maleate, and dimethyl itaconate, unsaturated carboxylic acids such as maleic acid, fumaric acid and itaconic acid, (substituted) norbornenes such as norbornene and methyl norbornene-5-carboxylate, unsaturated acid anhydrides such as maleic anhydride and itaconic anhydride, and other monomers.

In the inventive polymers, appropriate proportions of the respective recurring units derived from the monomers are given below. The inventive polymers may contain:

(I) recurring units of formula (1) derived from monomer of formula (1a) in a proportion of 1 to 60 mol %, preferably 10 to 50 mol %, and more preferably 20 to 45 mol %, (II) recurring units of formula (2) derived from monomer of formula (2a) in a proportion of 1 to 60 mol %, preferably 5 to 50 mol %, and more preferably 20 to 45 mol %, (III) recurring units of formula (3) derived from monomer of formula (3a) in a proportion of 1 to 50 mol %, preferably 5 to 40 mol %, and more preferably 10 to 35 mol %, (IV) recurring units of formula (4) derived from monomer of formula (4a) in a proportion of 0 to 60 mol %, preferably 0 to 50 mol %, more preferably 5 to 40 mol %, and even more preferably 10 to 30 mol %, (V) recurring units of formula (5) derived from monomer of formula (5a) in a proportion of 0 to 30 mol %, preferably 3 to 20 mol %, and more preferably 5 to 15 mol %, (VI) recurring units of formula (6) derived from monomer of formula (6a) in a proportion of 0 to 30 mol %, preferably 3 to 25 mol %, and more preferably 5 to 20 mol %, and (VII) recurring units derived from another monomer in a proportion of 0 to 40 mol %, preferably 0 to 30 mol %, and more preferably 0 to 20 mol %, based on the total moles of constituent units.

The monomer of formula (1a) from which units of formula (1) essential to the inventive polymers are derived is commercially available and may be prepared by the method described in JP-A 2000-159758.

The monomer of formula (2a) from which units of formula (2) are derived is commercially available and may be prepared from 2-chloromethyloxyadamantane as the starting material by a known organochemical method.

The monomer of formula (3a) from which units of formula (3) are derived is commercially available and may be prepared from a hydroxyadamantane as the starting material by a known organochemical method.

The monomer of formula (4a) from which units of formula (4) are derived is commercially available and may be prepared from a norbornane carboxylate, adamantane carboxylate, cyclopentanone, cyclohexanone or adamantanone as the starting material by a known organochemical method. In particular, the monomer of formula (4) wherein $R^8$ is ($R^8$-2) can be prepared by the methods described in JP-A 2000-336121 and JP-A 2002-285161.

The monomer of formula (5a) from which units of formula (5) are derived is commercially available.

The monomer of formula (6a) from which units of formula (6) are derived may be prepared by a known organochemical method or the methods described in Japanese Patent Application Nos. 2004-283788 and 2005-308044.

The copolymerization reaction to produce the inventive polymers may be performed in various modes, preferably radical polymerization.

The preferred conditions under which radical polymerization is performed include (a) a solvent selected from among hydrocarbons such as benzene, ethers such as tetrahydrofuran and propylene glycol monomethyl ether acetate (PGMEA), alcohols such as ethanol and isopropyl alcohol, ketones such as methyl ethyl ketone and methyl isobutyl ketone, and esters such as ethyl acetate and γ-butyrolactone; (b) a polymerization initiator selected from among azo compounds such as 2,2'-azobisisobutyronitrile and dimethyl 2,2'-azobis(2-methyl propionate), and peroxides such as benzoyl peroxide and lauroyl peroxide; (c) an optional chain transfer agent selected from among thiols such as octanethiol, 2-mercaptoethanol, 2-mercaptopropionic acid, benzenethiol, benzylthiol, and 1,3,5-benzene trithiol, dithiocarboxylates such as benzyl dithiobenzoate, cumyl dithiobenzoate, 2-cyanopropyl dithiobenzoate, and 2-cyanopropyl dithioacetate, trithio carbonates such as bis(2-phenylethyl)trithiocarbonate, S,S'-bis (2-hydroxyethyl-2'-butyrate)trithiocarbonate, and S,S'-bis(α, α'-dimethyl-α'-acetic acid)trithiocarbonate, (d) a reaction temperature in the range from about 0° C. to about 100° C., and (e) a reaction time in the range from about 0.5 hour to about 48 hours. However, reaction conditions outside the above ranges are not to be excluded.

Resist Composition

The polymer of the invention is useful as the base resin in a resist composition, specifically chemically amplified resist composition, and especially chemically amplified positive working resist composition. Therefore, in another aspect, the invention provides a resist composition comprising the polymer. The resist composition of the invention may comprise the inventive polymer as a base resin, an acid generator, an organic solvent, and optional other components.

Acid Generator

As the acid generator, a photoacid generator is typically used. It is any compound capable of generating an acid in response to high-energy radiation or electron beam. Suitable photoacid generators include sulfonium salts, iodonium salts, sulfonyldiazomethane, N-sulfonyloxyimide, and oxime-O-sulfonate acid generators. Exemplary acid generators are given below while they may be used alone or in admixture of two or more.

Sulfonium salts are salts of sulfonium cations with sulfonates, bis(substituted alkylsulfonyl)imides and tris(substituted alkylsulfonyl)methides. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxo-2-phenylethylthiacyclopentanium, 4-n-butoxynaphthyl-1-thiacyclopentanium, and 2-n-butoxynaphthyl-1-thiacyclopentanium. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4'-toluenesulfonyloxy)benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthyl-ethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl) ethanesulfonate. Exemplary bis(substituted alkylsulfonyl)imides include bistrifluoromethylsulfonylimide, bispentafluoroethylsulfonylimide, bisheptafluoropropylsulfonylimide, and 1,3-propylenebissulfonylimide. A typical tris(substituted alkylsulfonyl)methide is tristrifluoromethylsulfonylmethide. Sulfonium salts based on combination of the foregoing examples are included.

Iodonium salts are salts of iodonium cations with sulfonates, bis(substituted alkylsulfonyl)imides and tris(substituted alkylsulfonyl)methides. Exemplary iodonium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, methanesulfonate, 1,1-difluoro-2-naphthyl-ethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl) ethanesulfonate. Exemplary bis(substituted alkylsulfonyl)imides include bistrifluoromethylsulfonylimide, bispentafluoroethylsulfonylimide, bisheptafluoropropylsulfonylimide, and 1,3-propylenebissulfonylimide. A typical tris(substituted alkylsulfonyl)methide is tristrifluoromethylsulfonylmethide. Iodonium salts based on combination of the foregoing examples are included.

Exemplary sulfonyldiazomethane compounds include bissulfonyldiazomethane compounds and sulfonyl-carbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, bis(4-acetyloxyphenylsulfonyl)diazomethane, bis(4-methanesulfonyloxyphenylsulfonyl)diazomethane, bis(4-(4-toluenesulfonyloxy)phenylsulfonyl)diazomethane, bis(4-(n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate.

Benzoinsulfonate photoacid generators include benzoin tosylate, benzoin mesylate, and benzoin butanesulfonate.

Pyrogallol trisulfonate photoacid generators include pyrogallol, phloroglucinol, catechol, resorcinol, and hydroquinone, in which all the hydroxyl groups are substituted by trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl) ethanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate. Also useful are analogous nitrobenzyl sulfonate compounds in which the nitro group on the benzyl side is substituted by a trifluoromethyl group.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Photoacid generators in the form of glyoxime derivatives are described in Japanese Patent No. 2,906,999 and JP-A 9-301948 and include
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(methanesulfonyl)-α-dimethylglyoxime,
bis-O-(trifluoromethanesulfonyl)-α-dimethylglyoxime,
bis-O-(2,2,2-trifluoroethanesulfonyl)-α-dimethylglyoxime,
bis-O-(10-camphorsulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-trifluoromethylbenzenesulfonyl)-α-dimethylglyoxime,
bis-O-(xylenesulfonyl)-α-dimethylglyoxime,
bis-O-(trifluoromethanesulfonyl)-nioxime,
bis-O-(2,2,2-trifluoroethanesulfonyl)-nioxime,
bis-O-(10-camphorsulfonyl)-nioxime,
bis-O-(benzenesulfonyl)-nioxime,
bis-O-(p-fluorobenzenesulfonyl)-nioxime,
bis-O-(p-trifluoromethylbenzenesulfonyl)-nioxime, and
bis-O-(xylenesulfonyl)-nioxime.

Also included are the oxime sulfonates described in U.S. Pat. No. 6,004,724, for example,
(5-(4-toluenesulfonyl)oxyimino-5H-thiophen-2-ylidene)phenylacetonitrile,
(5-(10-camphorsulfonyl)oxyimino-5H-thiophen-2-ylidene)phenylacetonitrile,
(5-n-octanesulfonyloxyimino-5H-thiophen-2-ylidene)phenylacetonitrile,
(5-(4-toluenesulfonyl)oxyimino-5H-thiophen-2-ylidene)(2-methylphenyl)acetonitrile,
(5-(10-camphorsulfonyl)oxyimino-5H-thiophen-2-ylidene)(2-methylphenyl)acetonitrile, (5-n-octanesulfonyloxyimino-5H-thiophen-2-ylidene)(2-methyl-phenyl)acetonitrile, etc. Also included are the oxime sulfonates described in U.S. Pat. No. 6,916,591, for example,
(5-(4-(4-toluenesulfonyloxy)benzenesulfonyl)oxyimino-5H-thiophen-2-ylidene)phenylacetonitrile and
(5-(2,5-bis(4-toluenesulfonyloxy)benzenesulfonyl)oxyimino-5H-thiophen-2-ylidene)phenylacetonitrile.

Also included are the oxime sulfonates described in U.S. Pat. No. 6,261,738 and JP-A 2000-314956, for example, 2,2,2-trifluoro-1-phenyl-ethanone oxime-O-methylsulfonate; 2,2,2-trifluoro-1-phenyl-ethanone oxime-O-(10-camphorylsulfonate); 2,2,2-trifluoro-1-phenyl-ethanone oxime-O-(4-methoxyphenylsulfonate); 2,2,2-trifluoro-1-phenyl-ethanone oxime-O-(1-naphthylsulfonate); 2,2,2-trifluoro-1-phenyl-ethanone oxime-O-(2-naphthylsulfonate); 2,2,2-trifluoro-1-phenyl-ethanone oxime-O-(2,4,6-trimethylphenylsulfonate); 2,2,2-trifluoro-1-(4-methylphenyl)-ethanone oxime-O-(10-camphorylsulfonate); 2,2,2-trifluoro-1-(4-methylphenyl)-ethanone oxime-O-(methylsulfonate); 2,2,2-trifluoro-1-(2-methylphenyl)-ethanone oxime-O-(10-camphorylsulfonate); 2,2,2-trifluoro-1-(2,4-dimethylphenyl)-ethanone oxime-O-(10-camphorylsulfonate); 2,2,2-trifluoro-1-(2,4-dimethylphenyl)-ethanone oxime-O-(1-naphthylsulfonate); 2,2,2-trifluoro-1-(2,4-dimethylphenyl)-ethanone oxime-O-(2-naphthylsulfonate); 2,2,2-trifluoro-1-(2,4,6-trimethylphenyl)-ethanone oxime-O-(10-camphorylsulfonate); 2,2,2-trifluoro-1-(2,4,6-trimethylphenyl)-ethanone oxime-O-(1-naphthylsulfonate); 2,2,2-trifluoro-1-(2,4,6-trimethylphenyl)-ethanone oxime-O-(2-naphthylsulfonate); 2,2,2-trifluoro-1-(4-methoxyphenyl)-ethanone oxime-O-methylsulfonate; 2,2,2-trifluoro-1-(4-methylthiophenyl)-ethanone oxime-O-methylsulfonate; 2,2,2-trifluoro-1-(3,4-dimethoxyphenyl)-ethanone oxime-O-methylsulfonate; 2,2,3,3,4,4,4-heptafluoro-1-phenyl-butanone oxime-O-(10-camphorylsulfonate); 2,2,2-trifluoro-1-(phenyl)-ethanone oxime-O-methylsulfonate; 2,2,2-trifluoro-1-(phenyl)-ethanone oxime-O-10-camphorylsulfonate; 2,2,2-trifluoro-1-(phenyl)-ethanone oxime-O-(4-methoxyphenyl)sulfonate; 2,2,2-trifluoro-1-(phenyl)-ethanone oxime-O-(1-naphthyl)sulfonate; 2,2,2-trifluoro-1-(phenyl)-ethanone oxime-O-(2-naphthyl)sulfonate; 2,2,2-trifluoro-1-(phenyl)-ethanone oxime-O-(2,4,6-trimethylphenyl)sulfonate; 2,2,2-trifluoro-1-(4-methylphenyl)-ethanone oxime-O-(10-camphoryl)sulfonate; 2,2,2-trifluoro-1-(4-methylphenyl)-ethanone oxime-O-methylsulfonate; 2,2,2-trifluoro-1-(2-methylphenyl)-ethanone oxime-O-(10-camphoryl)sulfonate; 2,2,2-trifluoro-1-(2,4-dimethylphenyl)-ethanone oxime-O-(1-naphthyl)sulfonate; 2,2,2-trifluoro-1-(2,4-dimethylphenyl)-ethanone oxime-O-(2-naphthyl)sulfonate; 2,2,2-trifluoro-1-(2,4,6-trimethylphenyl)-ethanone oxime-O-(10-camphoryl)sulfonate; 2,2,2-trifluoro-1-(2,4,6-trimethylphenyl)-ethanone oxime-O-(1-naphthyl)sulfonate; 2,2,2-trifluoro-1-(2,4,6-trimethylphenyl)-ethanone oxime-O-(2-naphthyl)sulfonate; 2,2,2-trifluoro-1-(4-methoxyphenyl)-ethanone oxime-O-methylsulfonate; 2,2,2-trifluoro-1-(4-thiomethylphenyl)-ethanone oxime-O-methylsulfonate; 2,2,2-trifluoro-1-(3,4-dimethoxyphenyl)-ethanone oxime-O-methylsulfonate; 2,2,2-trifluoro-1-(4-methoxyphenyl)-ethanone oxime-O-(4-methylphenyl)sulfonate; 2,2,2-trifluoro-1-(4-methoxyphenyl)-ethanone oxime-o-(4-methoxyphenyl)sulfonate; 2,2,2-trifluoro-1-(4-methoxyphenyl)-ethanone oxime-O-(4-dodecylphenyl)-sulfonate; 2,2,2-trifluoro-1-(4-methoxyphenyl)-ethanone oxime-O-octylsulfonate; 2,2,2-trifluoro-1-(4-thiomethylphenyl)-ethanone oxime-O-(4-methoxyphenyl)sulfonate; 2,2,2-trifluoro-1-(4-thiomethylphenyl)-ethanone oxime-O-(4-dodecylphenyl)sulfonate; 2,2,2-trifluoro-1-(4-thiomethylphenyl)-ethanone oxime-O-octylsulfonate; 2,2,2-trifluoro-1-(4-thiomethylphenyl)-ethanone oxime-O-(2-naphthyl)sulfonate; 2,2,2-trifluoro-1-(2-methylphenyl)-ethanone oxime-O-methylsulfonate; 2,2,2-trifluoro-1-(4-methylphenyl)ethanone oxime-O-phenylsulfonate; 2,2,2-trifluoro-1-(4-chlorophenyl)-ethanone oxime-O-phenylsulfonate; 2,2,3,3,4,4,4-heptafluoro-1-(phenyl)-butanone oxime-O-(10-camphoryl)sulfonate; 2,2,2-trifluoro-1-naphthyl-ethanone oxime-O-methylsulfonate; 2,2,2-trifluoro-2-naphthyl-ethanone oxime-O-methylsulfonate; 2,2,2-trifluoro-1-[4-benzylphenyl]-ethanone oxime-O-methylsulfonate; 2,2,2-trifluoro-1-[4-(phenyl-1,4-dioxa-but-1-yl)phenyl]-ethanone oxime-O-methylsulfonate; 2,2,2-trifluoro-1-naphthyl-ethanone oxime-O-propylsulfonate; 2,2,2-trifluoro-2-naphthyl-ethanone oxime-O-propylsulfonate; 2,2,2-trifluoro-1-[4-benzylphenyl]-ethanone oxime-O-propylsulfonate; 2,2,2-trifluoro-1-[4-methylsulfonylphenyl]-ethanone oxime-O-propylsulfonate; 1,3-bis[1-(4-phenoxyphenyl)-2,2,2-trifluoroethanone oxime-O-sulfonyl]phenyl; 2,2,2-trifluoro-1-[4-methylsulfonyl-oxyphenyl]-ethanone oxime-O-propylsulfonate; 2,2,2-trifluoro-1-[4-methylcarbonyloxyphenyl]-ethanone oxime-O-propylsulfonate; 2,2,2-trifluoro-1-[6H,7H-5,8-dioxonaphth-2-yl]-ethanone oxime-O-propylsulfonate; 2,2,2-trifluoro-1-[4-methoxycarbonylmethoxyphenyl]-ethanone oxime-O-propylsulfonate; 2,2,2-trifluoro-1-[4-(methoxycarbonyl)-(4-amino-1-oxa-pent-1-yl)-phenyl]-ethanone oxime-O-propylsulfonate; 2,2,2-trifluoro-1-[3,5-dimethyl-4-ethoxyphenyl]-ethanone oxime-O-propylsulfonate; 2,2,2-trifluoro-1-[4-benzyloxyphenyl]-ethanone oxime-O-propylsulfonate; 2,2,2-trifluoro-1-[2-thiophenyl]-ethanone oxime-O-propylsulfonate; 2,2,2-trifluoro-1-[1-dioxathiophen-2-yl)]-ethanone oxime-O-propylsulfonate; 2,2,2-trifluoro-1-(4-(3-(4-(2,2,2-trifluoro-1-(trifluoromethanesulfonyloxyimino)-ethyl)-phenoxy)-propoxy)-phenyl)ethanone oxime(trifluoromethanesulfonate); 2,2,2-trifluoro-1-(4-(3-(4-(2,2,2-trifluoro-1-(1-propanesulfonyloxyimino)-ethyl)-phenoxy)-propoxy)-phenyl)ethanone oxime(1-propanesulfonate); and 2,2,2-trifluoro-1-(4-(3-(4-(2,2,2-trifluoro-1-(1-butanesulfonyloxyimino)-ethyl)-phenoxy)-propoxy)-phenyl)ethanone oxime(1-butanesulfonate). Also included are the oxime sulfonates described in U.S. Pat. No. 6,916,591, for example, 2,2,2-trifluoro-1-(4-(3-(4-(2,2,2-trifluoro-1-(4-(4-methylphenylsulfonyloxy)phenylsulfonyloxyimino)-ethyl)-phenoxy)-propoxy)-phenyl)ethanone oxime(4-(4-methylphenylsulfonyloxy)phenylsulfonate) and 2,2,2-trifluoro-1-(4-(3-(4-(2,2,2-trifluoro-1-(2,5-bis(4-methylphenylsulfonyloxy)-benzenesulfonyloxy)phenylsulfonyloxyimino)-ethyl)-phenoxy)-propoxy)-phenyl)ethanone oxime(2,5-bis(4-methylphenyl-sulfonyloxy)benzenesulfonyloxy)phenylsulfonate).

Also included are the oxime sulfonates described in JP-A 9-95479 and JP-A 9-230588 and the references cited therein, for example,
α-(p-toluenesulfonyloxyimino)-phenylacetonitrile,
α-(p-chlorobenzenesulfonyloxyimino)-phenylacetonitrile,
α-(4-nitrobenzenesulfonyloxyimino)-phenylacetonitrile,
α-(4-nitro-2-trifluoromethylbenzenesulfonyloxyimino)-phenylacetonitrile,
α-(benzenesulfonyloxyimino)-4-chlorophenylacetonitrile,
α-(benzenesulfonyloxyimino)-2,4-dichlorophenylacetonitrile,
α-(benzenesulfonyloxyimino)-2,6-dichlorophenylacetonitrile, α-(benzenesulfonyloxyimino)-4-methoxyphenylacetonitrile,
α-(2-chlorobenzenesulfonyloxyimino)-4-methoxyphenylacetonitrile,
α-(benzenesulfonyloxyimino)-2-thienylacetonitrile,
α-(4-dodecylbenzenesulfonyloxyimino)-phenylacetonitrile,
α-[(4-toluenesulfonyloxyimino)-4-methoxyphenyl]acetonitrile,
α-[(dodecylbenzenesulfonyloxyimino)-4-methoxyphenyl]acetonitrile,
α-(tosyloxyimino)-3-thienylacetonitrile,
α-(methylsulfonyloxyimino)-1-cyclopentenylacetonitrile,
α-(ethylsulfonyloxyimino)-1-cyclopentenylacetonitrile,
α-(isopropylsulfonyloxyimino)-1-cyclopentenylacetonitrile,
α-(n-butylsulfonyloxyimino)-1-cyclopentenylacetonitrile,
α-(ethylsulfonyloxyimino)-1-cyclohexenylacetonitrile,
α-(isopropylsulfonyloxyimino)-1-cyclohexenylacetonitrile, and
α-(n-butylsulfonyloxyimino)-1-cyclohexenylacetonitrile.

Also included are oxime sulfonates having the formula:

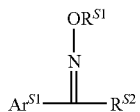

wherein $R^{s1}$ is a substituted or unsubstituted haloalkylsulfonyl or halobenzenesulfonyl group of 1 to 10 carbon atoms, $R^{s2}$ is a haloalkyl group of 1 to 11 carbon atoms, and $Ar^{s1}$ is substituted or unsubstituted aromatic or hetero-aromatic group, as described in WO 2004/074242. Examples include
2-[2,2,3,3,4,4,5,5-octafluoro-1-(nonafluorobutylsulfonyloxyimino)-pentyl]-fluorene,
2-[2,2,3,3,4,4-pentafluoro-1-(nonafluorobutylsulfonyloxyimino)-butyl]-fluorene,
2-[2,2,3,3,4,4,5,5,6,6-decafluoro-1-(nonafluorobutylsulfonyloxyimino)-hexyl]-fluorene,
2-[2,2,3,3,4,4,5,5-octafluoro-1-(nonafluorobutylsulfonyloxyimino)-pentyl]-4-biphenyl,
2-[2,2,3,3,4,4-pentafluoro-1-(nonafluorobutylsulfonyloxyimino)-butyl]-4-biphenyl, and
2-[2,2,3,3,4,4,5,5,6,6-decafluoro-1-(nonafluorobutylsulfonyloxyimino)-hexyl]-4-biphenyl.

Suitable bisoxime sulfonates include those described in JP-A 9-208554, for example,
bis(α-(4-toluenesulfonyloxy)imino)-p-phenylenediacetonitrile,
bis(α-(benzenesulfonyloxy)imino)-p-phenylenediacetonitrile,
bis(α-(methanesulfonyloxy)imino)-p-phenylenediacetonitrile,
bis(α-(butanesulfonyloxy)imino)-p-phenylenediacetonitrile,
bis(α-(10-camphorsulfonyloxy)imino)-p-phenylenediacetonitrile,
bis(α-(4-toluenesulfonyloxy)imino)-p-phenylenediacetonitrile,
bis(α-(trifluoromethanesulfonyloxy)imino)-p-phenylenediacetonitrile,
bis(α-(4-methoxybenzenesulfonyloxy)imino)-p-phenylenediacetonitrile,
bis(α-(4-toluenesulfonyloxy)imino)-m-phenylenediacetonitrile,
bis(α-(benzenesulfonyloxy)imino)-m-phenylenediacetonitrile,
bis(α-(methanesulfonyloxy)imino)-m-phenylenediacetonitrile,
bis(α-(butanesulfonyloxy)imino)-m-phenylenediacetonitrile,
bis(α-(10-camphorsulfonyloxy)imino)-m-phenylenediacetonitrile,
bis(α-(4-toluenesulfonyloxy)imino)-m-phenylenediacetonitrile,
bis(α-(trifluoromethanesulfonyloxy)imino)-m-phenylenediacetonitrile,
bis(α-(4-methoxybenzenesulfonyloxy)imino)-m-phenylenediacetonitrile, etc.

Of these, preferred photoacid generators are sulfonium salts, bissulfonyldiazomethanes, N-sulfonyloxyimides, oxime-O-sulfonates and glyoxime derivatives. More preferred photoacid generators are sulfonium salts, bissulfonyldiazomethanes, N-sulfonyloxyimides, and oxime-O-sulfonates. Typical examples include triphenylsulfonium p-toluenesulfonate, triphenylsulfonium camphorsulfonate, triphenylsulfonium pentafluorobenzenesulfonate, triphenylsulfonium nonafluorobutanesulfonate, triphenylsulfonium 4-(4'-toluenesulfonyloxy)benzenesulfonate, triphenylsulfonium 2,4,6-triisopropylbenzenesulfonate, 4-tert-butoxyphenyldiphenylsulfonium p-toluenesulfonate, 4-tert-butoxyphenyldiphenylsulfonium camphorsulfonate, 4-tert-butoxyphenyldiphenylsulfonium 4-(4'-toluenesulfonyloxy)benzenesulfonate, tris(4-methylphenyl)sulfonium camphorsulfonate, tris(4-tert-butylphenyl)sulfonium camphorsulfonate, 4-tert-butylphenyldiphenylsulfonium camphorsulfonate, 4-tert-butylphenyldiphenylsulfonium nonafluoro-1-butanesulfonate, 4-tert-butylphenyldiphenylsulfonium pentafluoroethylperfluorocyclohexanesulfonate, 4-tert-butylphenyldiphenylsulfonium perfluoro-1-octanesulfonate, triphenylsulfonium 1,1-difluoro-2-naphthyl-ethanesulfonate, triphenylsulfonium 1,1,2,2-tetrafluoro-2-(norbornan-2-yl)-ethanesulfonate, bis(tert-butylsulfonyl)diazomethane, bis(cyclohexylsulfonyl)diazomethane, bis(2,4-dimethylphenylsulfonyl)diazomethane, bis(4-(n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)diazomethane, bis(4-tert-butylphenylsulfonyl)diazomethane, N-camphorsulfonyloxy-5-norbornene-2,3-dicarboxylic acid imide, N-p-toluenesulfonyloxy-5-norbornene-2,3-dicarboxylic acid imide, 2-[2,2,3,3,4,4,5,5-octafluoro-1-(nonafluorobutylsulfonyloxyimino)-pentyl]-fluorene, 2-[2,2,3,3,4,4-pentafluoro-1-(nonafluorobutylsulfonyloxyimino)-butyl]-fluorene, and 2-[2,2,3,3,4,4,5,5,6,6-decafluoro-1-(nonafluorobutylsulfonyloxyimino)-hexyl]-fluorene.

In the resist composition, an appropriate amount of the photoacid generator is, but not limited to, 0.1 to 10 parts, and especially 0.1 to 5 parts by weight per 100 parts by weight of the base resin. Too high a proportion of the photoacid generator may give rise to problems of degraded resolution and foreign matter upon development and resist film peeling. The photoacid generators may be used alone or in admixture of two or more. The transmittance of the resist film can be controlled by using a photoacid generator having a low transmittance at the exposure wavelength and adjusting the amount of the photoacid generator added.

In the resist composition, there may be added a compound which is decomposed with an acid to generate an acid, that is, acid-amplifier compound. For these compounds, reference should be made to J. Photopolym. Sci. and Tech., 8, 43-44, 45-46 (1995), and ibid., 9, 29-30 (1996).

Examples of the acid-amplifier compound include tert-butyl-2-methyl-2-tosyloxymethyl acetoacetate and 2-phenyl-2-(2-tosyloxyethyl)-1,3-dioxolane, but are not limited thereto. Of well-known photoacid generators, many of those compounds having poor stability, especially poor thermal stability exhibit an acid amplifier-like behavior.

In the resist composition, an appropriate amount of the acid-amplifier compound is up to 2 parts, and especially up to 1 part by weight per 100 parts by weight of the base resin. Excessive amounts of the acid-amplifier compound make diffusion control difficult, leading to degradation of resolution and pattern profile.

Organic Solvent

The organic solvent used herein may be any organic solvent in which the base resin, photoacid generator, and other components are soluble. Illustrative, non-limiting, examples of the organic solvent include ketones such as cyclohexanone and methyl n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, propylene glycol monomethyl ether acetate, and mixtures thereof because the acid generator is most soluble therein.

An appropriate amount of the organic solvent used is about 200 to 1,000 parts, especially about 400 to 800 parts by weight per 100 parts by weight of the solids in the resist composition.

Other Polymer

To the resist composition of the invention, another polymer other than the inventive polymer may also be added. The other polymers that can be added to the resist composition are, for example, those polymers comprising units of the following formula (R1) or (R2) and having a weight average molecular weight of about 1,000 to about 100,000, especially about 3,000 to about 30,000 although the other polymers are not limited thereto.

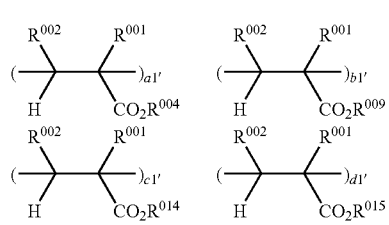

(R1)

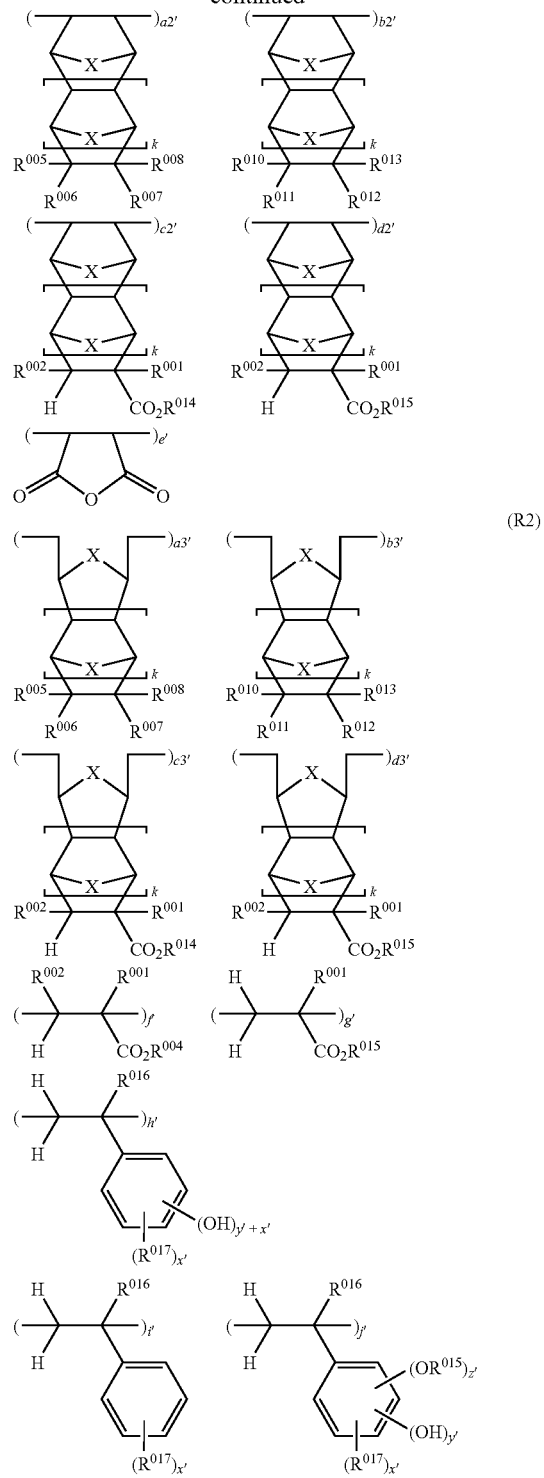

Herein, $R^{001}$ is hydrogen, methyl or $CH_2CO_2R^{003}$. $R^{002}$ is hydrogen, methyl or $CO_2R^{003}$. $R^{003}$ is a straight, branched or cyclic $C_1$-$C_{15}$ alkyl group, for example, methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl. $R^{004}$ is hydrogen or a monovalent $C_1$-$C_{15}$ hydrocarbon group having a carboxyl or hydroxyl group, for example, hydrogen, carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl, and hydroxyadamantyl.

At least one of $R^{005}$ to $R^{008}$ represents a monovalent $C_1$-$C_{15}$ hydrocarbon group having a carboxyl or hydroxyl group while the remaining R's independently represent hydrogen or a straight, branched or cyclic $C_1$-$C_{15}$ alkyl group. Examples of the carboxyl or hydroxyl-bearing monovalent $C_1$-$C_{15}$ hydrocarbon group include carboxy, carboxymethyl, carboxyethyl, carboxybutyl, hydroxymethyl, hydroxyethyl, hydroxybutyl, 2-carboxyethoxycarbonyl, 4-carboxybutoxycarbonyl, 2-hydroxyethoxycarbonyl, 4-hydroxybutoxycarbonyl, carboxycyclopentyloxycarbonyl, carboxycyclohexyloxycarbonyl, carboxynorbornyloxycarbonyl, carboxyadamantyloxycarbonyl, hydroxycyclopentyloxycarbonyl, hydroxycyclohexyloxycarbonyl, hydroxynorbornyloxycarbonyl, and hydroxyadamantyloxycarbonyl. Examples of the straight, branched or cyclic $C_1$-$C_{15}$ alkyl group are the same as exemplified for $R^{003}$.

Alternatively, $R^{005}$ to $R^{008}$, taken together, may form a ring, and in that event, at least one of $R^{005}$ to $R^{008}$ is a divalent $C_1$-$C_{15}$ hydrocarbon group having a carboxyl or hydroxyl group, while the remaining R's are independently single bonds or straight, branched or cyclic $C_1$-$C_{15}$ alkylene groups. Examples of the carboxyl or hydroxyl-bearing divalent $C_1$-$C_{15}$ hydrocarbon group include the groups exemplified as the carboxyl or hydroxyl-bearing monovalent hydrocarbon group, with one hydrogen atom eliminated therefrom. Examples of the straight, branched or cyclic $C_1$-$C_{15}$ alkylene groups include the groups exemplified for $R^{003}$, with one hydrogen atom eliminated therefrom.

$R^{009}$ is a monovalent $C_3$-$C_{15}$ hydrocarbon group containing a —$CO_2$— partial structure, for example, 2-oxooxolan-3-yl, 4,4-dimethyl-2-oxooxolan-3-yl, 4-methyl-2-oxooxan-4-yl, 2-oxo-1,3-dioxolan-4-ylmethyl, and 5-methyl-2-oxooxolan-5-yl.

At least one of $R^{010}$ to $R^{013}$ is a monovalent $C_2$-$C_{15}$ hydrocarbon group containing a —$CO_2$— partial structure, while the remaining R's are independently hydrogen or straight, branched or cyclic $C_1$-$C_{15}$ alkyl groups. Examples of the monovalent $C_2$-$C_{15}$ hydrocarbon group containing a —$CO_2$— partial structure include 2-oxooxolan-3-yloxycarbonyl, 4,4-dimethyl-2-oxooxolan-3-yloxycarbonyl, 4-methyl-2-oxooxan-4-yloxycarbonyl, 2-oxo-1,3-dioxolan-4-ylmethyloxycarbonyl, and 5-methyl-2-oxooxolan-5-yloxycarbonyl. Examples of the straight, branched or cyclic $C_1$-$C_{15}$ alkyl groups are the same as exemplified for $R^{003}$.

$R^{010}$ to $R^{013}$, taken together, may form a ring, and in that event, at least one of $R^{010}$ to $R^{013}$ is a divalent $C_1$-$C_{15}$ hydrocarbon group containing a —$CO_2$— partial structure, while the remaining R's are independently single bonds or straight, branched or cyclic $C_1$-$C_{15}$ alkylene groups. Examples of the divalent $C_1$-$C_{15}$ hydrocarbon group containing a —$CO_2$— partial structure include 1-oxo-2-oxapropane-1,3-diyl, 1,3-dioxo-2-oxapropane-1,3-diyl, 1-oxo-2-oxabutane-1,4-diyl, and 1,3-dioxo-2-oxabutane-1,4-diyl, as well as the groups exemplified as the monovalent hydrocarbon group containing a —$CO_2$— partial structure, with one hydrogen atom eliminated therefrom. Examples of the straight, branched or cyclic $C_1$-$C_{15}$ alkylene groups include the groups exemplified for $R^{003}$, with one hydrogen atom eliminated therefrom.

$R^{014}$ is a polycyclic $C_1$-$C_{15}$ hydrocarbon group or an alkyl group containing a polycyclic hydrocarbon group, for example, norbornyl, bicyclo[3.3.1]nonyl, tricyclo[5.2.1.0$^{2,6}$] decyl, adamantyl, ethyladamantyl, butyladamantyl, norbornylmethyl, and adamantylmethyl.

$R^{015}$ is an acid labile group, which will be described later.

X is $CH_2$ or an oxygen atom.

The subscript k is 0 or 1.

The acid labile groups represented by $R^{015}$ may be selected from a variety of such groups. Examples of the acid labile group are groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

(L1)

(L2)

(L3)

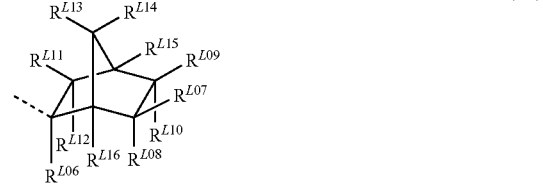

(L4)

The broken line indicates a bonding site and direction.

The subscript y is an integer of 0 to 6, m is 0 or 1, n is 0, 1, 2 or 3, and 2m+n is equal to 2 or 3.

$R^{L01}$ and $R^{L02}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, and n-octyl.

$R^{L03}$ is a monovalent hydrocarbon group of 1 to 18 carbon atoms, preferably 1 to 10 carbon atoms, which may contain a hetero atom such as oxygen, examples of which include unsubstituted straight, branched or cyclic alkyl groups and straight, branched or cyclic alkyl groups in which some hydrogen atoms are replaced by hydroxyl, alkoxy, oxo, amino, alkylamino or the like. Illustrative examples are the substituted alkyl groups shown below wherein the broken line indicates a bonding site.

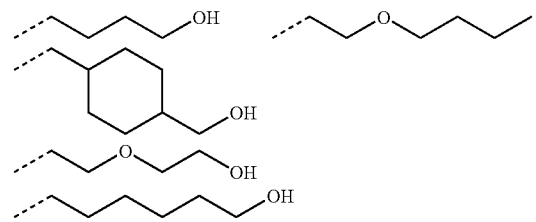

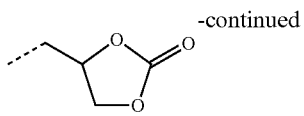

A pair of $R^{L01}$ and $R^{L02}$, $R^{L01}$ and $R^{L03}$, or $R^{L02}$ and $R^{L03}$ may form a ring. Each of $R^{L01}$, $R^{L02}$ and $R^{L03}$ is a straight or branched alkylene group of 1 to 18 carbon atoms, preferably 1 to 10 carbon atoms when they form a ring.

$R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl.

$R^{L05}$ is a substituted or unsubstituted, $C_1$-$C_8$ straight, branched or cyclic alkyl group or a substituted or unsubstituted $C_6$-$C_{20}$ aryl group. Examples of the substituted or unsubstituted alkyl groups include straight, branched or cyclic ones such as methyl, ethyl, propyl, isopropyl, n-butyl, sec-butyl, tert-butyl, tert-amyl, n-pentyl, n-hexyl, cyclopentyl and cyclohexyl, and substituted forms of the foregoing in which some hydrogen atoms are replaced by hydroxyl, alkoxy, carboxy, alkoxycarbonyl, oxo, amino, alkylamino, cyano, mercapto, alkylthio, sulfo or other groups. Exemplary substituted or unsubstituted aryl groups are phenyl, methylphenyl, naphthyl, anthryl, phenanthryl, and pyrenyl.

$R^{L06}$ is a substituted or unsubstituted, $C_1$-$C_8$ straight, branched or cyclic alkyl group or a substituted or unsubstituted $C_6$-$C_{20}$ aryl group. Examples of these groups are the same as exemplified for $R^{L05}$.

$R^{L07}$ to $R^{L16}$ independently represent hydrogen or monovalent $C_1$-$C_{15}$ hydrocarbon groups which may contain a hetero atom. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of the foregoing in which some hydrogen atoms are replaced by hydroxyl, alkoxy, carboxy, alkoxycarbonyl, oxo, amino, alkylamino, cyano, mercapto, alkylthio, sulfo or other groups. Alternatively, $R^{L07}$ to $R^{L16}$, taken together, may form a ring (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1$-$C_{15}$ hydrocarbon group which may contain a hetero atom, when they form a ring, examples of which are the ones exemplified above for the monovalent hydrocarbon groups, with one hydrogen atom being eliminated. Two of $R^{L07}$ to $R^{L16}$ which are attached to adjoining carbon atoms (for example, a pair of $R^{L07}$ and $R^{L09}$, $R^{L09}$ and $R^{L15}$, $R^{L13}$ and $R^{L15}$, or a similar pair) may bond together directly to form a double bond.

Of the acid labile groups of formula (L1), the straight and branched ones are exemplified by the following groups wherein the broken line indicates a bonding site.

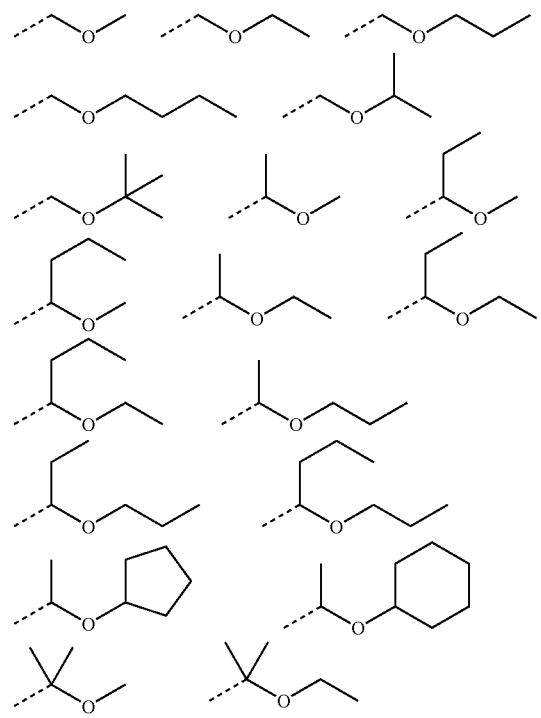

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl groups.

The acid labile groups of formula (L4) are exemplified by the following groups wherein the broken line indicates a bonding site and direction.

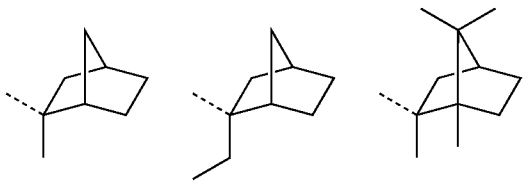

-continued

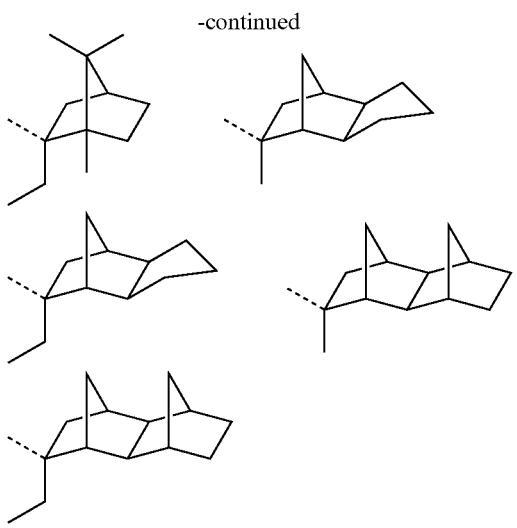

Examples of the tertiary $C_4$-$C_{20}$ alkyl, tri($C_1$-$C_6$-alkyl)silyl and $C_4$-$C_{20}$ oxoalkyl groups included in the acid labile groups represented by $R^{O15}$ are as exemplified above for $R^{LO4}$.

$R^{O16}$ is hydrogen or methyl. $R^{O17}$ is a straight, branched or cyclic $C_1$-$C_8$ alkyl group. Letters a1', a2', a3', b1', b2', b3', c1', c2', c3', d1', d2', d3', and e' are numbers from 0 to less than 1, satisfying a1'+a2'+a3'+b1'+b2'+b3'+c1'+c2'+c3'+d1'+d2'+d3'+e'=1; f', g', h', i', and j' are numbers from 0 to less than 1, satisfying f'+g'+h'+i'+j'=1; x', y' and z' are each an integer of 0 to 3, satisfying $1 \leq x'+y'+z' \leq 5$ and $1 \leq y'+z' \leq 3$.

The inventive polymer and the other polymer are preferably blended in a weight ratio from 100:0 to 10:90, more preferably from 100:0 to 20:80. If the blend ratio of the inventive polymer is below this range, the resist composition would become poor in some of the desired properties. The properties of the resist composition can be adjusted by properly changing the blend ratio of the inventive polymer.

The other polymer is not limited to one type and a mixture of two or more other polymers may be added. The use of plural polymers allows for easy adjustment of resist properties.

Dissolution Regulator

To the resist composition, a dissolution regulator may be added. The dissolution regulator is a compound having on the molecule at least two phenolic hydroxyl groups, in which an average of from 0 to 100 mol % of all the hydrogen atoms on the phenolic hydroxyl groups are replaced with acid labile groups or a compound having on the molecule at least one carboxyl group, in which an average of 50 to 100 mol % of all the hydrogen atoms on the carboxyl groups are replaced with acid labile groups, both the compounds having an average molecular weight within a range of 100 to 1,000, and preferably 150 to 800.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups with acid labile groups is on average at least 50 mol %, and preferably at least 70 mol %, of all the carboxyl groups, with the upper limit being 100 mol %.

Preferable examples of such compounds having two or more phenolic hydroxyl groups or compounds having at least one carboxyl group include those of formulas (D1) to (D14) below.

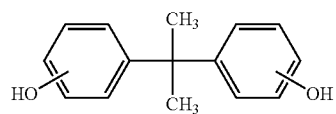
(D1)

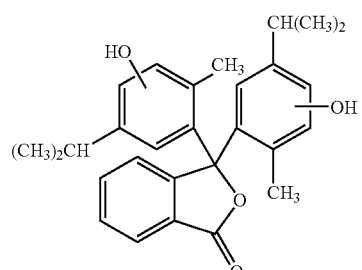
(D2)

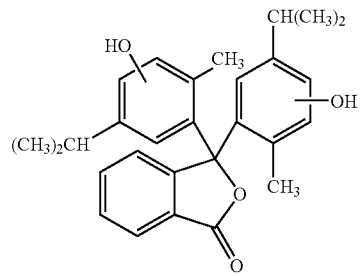

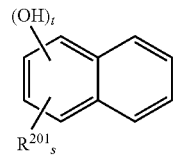
(D3)

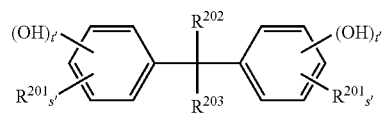
(D4)

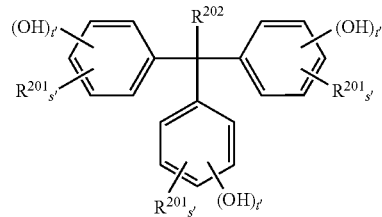
(D5)

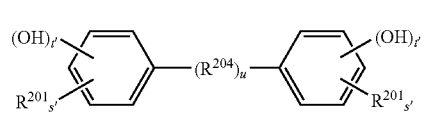
(D6)

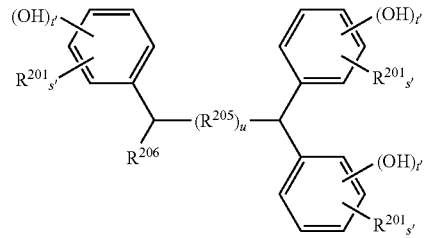
(D7)

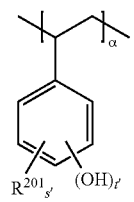
(D8)

-continued

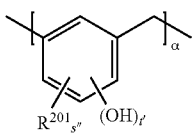
(D9)

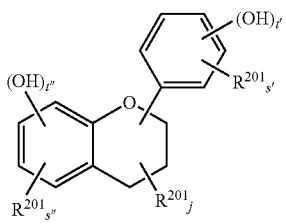
(D10)

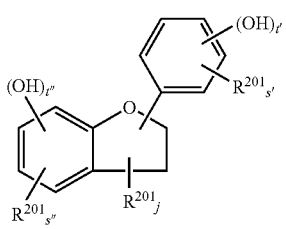
(D11)

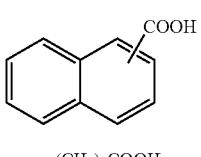
(D12)

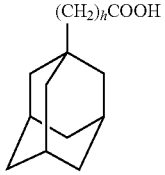
(D13)

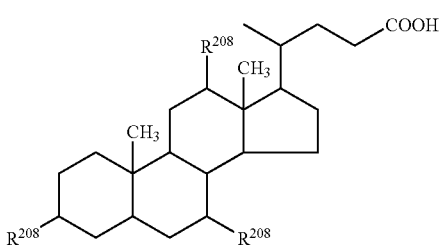
(D14)

In these formulas, $R^{201}$ and $R^{202}$ are each hydrogen or a straight or branched $C_1$-$C_8$ alkyl or alkenyl group, for example, hydrogen, methyl, ethyl, butyl, propyl, ethynyl and cyclohexyl.

$R^{203}$ is hydrogen, a straight or branched $C_1$-$C_8$ alkyl or alkenyl group, or —$(R^{207})_h$—COOH wherein $R^{207}$ is a straight or branched $C_1$-$C_{10}$ alkylene, for example, those exemplified for $R^{201}$ and $R^{202}$ and —COOH and —$CH_2COOH$.

$R^{204}$ is —$(CH_2)_i$— wherein i=2 to 10, $C_6$-$C_{10}$ arylene, carbonyl, sulfonyl, an oxygen atom, or a sulfur atom, for example, ethylene, phenylene, carbonyl, sulfonyl, oxygen atom or sulfur atom.

$R^{205}$ is a $C_1$-$C_{10}$ alkylene, a $C_6$-$C_{10}$ arylene, carbonyl, sulfonyl, an oxygen atom, or a sulfur atom, for example, methylene and those exemplified for $R^{204}$.

$R^{206}$ is hydrogen, a straight or branched $C_1$-$C_8$ alkyl or alkenyl, or a hydroxyl-substituted phenyl or naphthyl, for example, hydrogen, methyl, ethyl, butyl, propyl, ethynyl, cyclohexyl, hydroxyl-substituted phenyl, and hydroxyl-substituted naphthyl.

$R^{208}$ is hydrogen or hydroxyl.

The letter j is an integer from 0 to 5; u and h are each 0 or 1; s, t, s', t', s", and t" are each numbers which satisfy s+t=8, s'+t'=5, and s"+t"=4, and are such that each phenyl skeleton has at least one hydroxyl group; and α is a number such that the compounds of formula (D8) or (D9) have a weight average molecular weight of from 100 to 1,000.

Exemplary acid labile groups on the dissolution regulator include a variety of such groups, typically groups of the general formulae (L1) to (L4), tertiary alkyl groups of 4 to 20 carbon atoms, trialkylsilyl groups in which each of the alkyls has 1 to 6 carbon atoms, and oxoalkyl groups of 4 to 20 carbon atoms. Examples of the respective groups are as previously described.

The dissolution regulator may be formulated in an amount of 0 to 50 parts, preferably 0 to 40 parts, and more preferably 0 to 30 parts by weight, per 100 parts by weight of the base resin, and may be used singly or as a mixture of two or more thereof. The use of more than 50 parts of the dissolution regulator would lead to slimming of the patterned film, and thus a decline in resolution.

The dissolution regulator can be synthesized by introducing acid labile groups into a compound having phenolic hydroxyl or carboxyl groups in accordance with an organic chemical formulation.

Nitrogen-containing Compound

In the resist composition, an organic nitrogen-containing compound or compounds may be compounded. The organic nitrogen-containing compound used herein is preferably a compound capable of suppressing the rate of diffusion when the acid generated by the acid generator diffuses within the resist film. The inclusion of this type of organic nitrogen-containing compound holds down the rate of acid diffusion within the resist film, resulting in better resolution. In addition, it suppresses changes in sensitivity following exposure and reduces substrate and environment dependence, as well as improving the exposure latitude and the pattern profile.

Examples of organic nitrogen-containing compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, imide derivatives, and carbamate derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include. 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, benzamide, and 1-cyclohexylpyrrolidone. Suitable imide derivatives include phthalimide, succinimide, and maleimide. Suitable carbamate derivatives include N-t-butoxycarbonyl-N,N-dicyclohexylamine, N-t-butoxycarbonylbenzimidazole and oxazolidinone.

In addition, organic nitrogen-containing compounds of the following general formula (B)-1 may also be included alone or in admixture.

$$N(X)_n(Y)_{3-n} \quad (B)\text{-}1$$

In the formula, n is equal to 1, 2 or 3; side chain Y is independently hydrogen or a straight, branched or cyclic alkyl group of 1 to 20 carbon atoms which may contain an ether or hydroxyl group; and side chain X is independently selected from groups of the following general formulas (X)-1 to (X)-3, and two or three X's may bond together to form a ring.

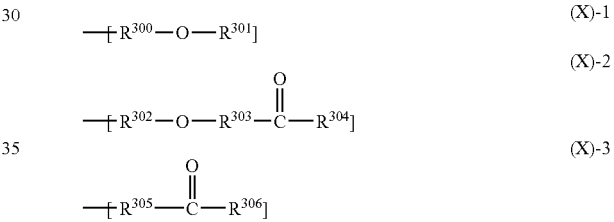

In the formulas, $R^{300}$, $R^{302}$ and $R^{305}$ are independently straight or branched alkylene groups of 1 to 4 carbon atoms; $R^{301}$ and $R^{304}$ are independently hydrogen, straight, branched or cyclic alkyl groups of 1 to 20 carbon atoms, which may contain at least one hydroxyl, ether, ester group or lactone ring; $R^{303}$ is a single bond or a straight or branched alkylene group of 1 to 4 carbon atoms; and $R^{306}$ is a straight, branched or cyclic alkyl group of 1 to 20 carbon atoms, which may contain at least one hydroxyl, ether, ester group or lactone ring.

Illustrative examples of the compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]ethylamine, N,N-bis(2-acetoxyethyl)-2-[(methoxycarbonyl)methoxycarbonyl]ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Also useful are one or more organic nitrogen-containing compounds having cyclic structure represented by the following general formula (B)-2.

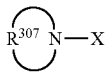

(B)-2

Herein X is as defined above, and $R^{307}$ is a straight or branched alkylene group of 2 to 20 carbon atoms which may contain one or more carbonyl, ether, ester or sulfide groups.

Illustrative examples of the organic nitrogen-containing compounds having formula (B)-2 include
1-[2-(methoxymethoxy)ethyl]pyrrolidine,
1-[2-(methoxymethoxy)ethyl]piperidine,
4-[2-(methoxymethoxy)ethyl]morpholine,
1-[2-[(2-methoxyethoxy)methoxy]ethyl]pyrrolidine,
1-[2-[(2-methoxyethoxy)methoxy]ethyl]piperidine,
4-[2-[(2-methoxyethoxy)methoxy]ethyl]morpholine,
2-(1-pyrrolidinyl)ethyl acetate, 2-piperidinoethyl acetate,
2-morpholinoethyl acetate, 2-(1-pyrrolidinyl)ethyl formate,
2-piperidinoethyl propionate,
2-morpholinoethyl acetoxyacetate,
2-(1-pyrrolidinyl)ethyl methoxyacetate,
4-[2-(methoxycarbonyloxy)ethyl]morpholine,
1-[2-(t-butoxycarbonyloxy)ethyl]piperidine,
4-[2-(2-methoxyethoxycarbonyloxy)ethyl]morpholine,
methyl 3-(1-pyrrolidinyl)propionate,
methyl 3-piperidinopropionate, methyl 3-morpholinopropionate,
methyl 3-(thiomorpholino)propionate,
methyl 2-methyl-3-(1-pyrrolidinyl)propionate,
ethyl 3-morpholinopropionate,
methoxycarbonylmethyl 3-piperidinopropionate,
2-hydroxyethyl 3-(1-pyrrolidinyl)propionate,
2-acetoxyethyl 3-morpholinopropionate,
2-oxotetrahydrofuran-3-yl 3-(1-pyrrolidinyl)propionate,
tetrahydrofurfuryl 3-morpholinopropionate,
glycidyl 3-piperidinopropionate,
2-methoxyethyl 3-morpholinopropionate,
2-(2-methoxyethoxy)ethyl 3-(1-pyrrolidinyl)propionate,
butyl 3-morpholinopropionate,
cyclohexyl 3-piperidinopropionate,
α-(1-pyrrolidinyl)methyl-γ-butyrolactone,
β-piperidino-γ-butyrolactone, β-morpholino-δ-valerolactone,
methyl 1-pyrrolidinylacetate, methyl piperidinoacetate,
methyl morpholinoacetate, methyl thiomorpholinoacetate,
ethyl 1-pyrrolidinylacetate, and
2-methoxyethyl morpholinoacetate.

Also, one or more organic nitrogen-containing compounds having cyano group represented by the following general formulae (B)-3 to (B)-6 may be blended.

(B)-3

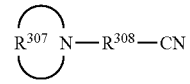

(B)-4

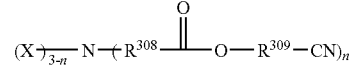

(B)-5

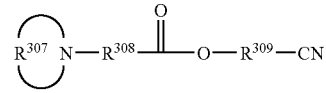

(B)-6

Herein, X, $R^{307}$ and n are as defined above, and $R^{308}$ and $R^{309}$ are each independently a straight or branched alkylene group of 1 to 4 carbon atoms.

Illustrative examples of the organic nitrogen-containing compounds having cyano represented by formulae (B)-3 to (B)-6 include
3-(diethylamino)propiononitrile,
N,N-bis(2-hydroxyethyl)-3-aminopropiononitrile,
N,N-bis(2-acetoxyethyl)-3-aminopropiononitrile,
N,N-bis(2-formyloxyethyl)-3-aminopropiononitrile,
N,N-bis(2-methoxyethyl)-3-aminopropiononitrile,
N,N-bis[2-(methoxymethoxy)ethyl]-3-aminopropiononitrile, methyl N-(2-cyanoethyl)-N-(2-methoxyethyl)-3-aminopropionate,
methyl N-(2-cyanoethyl)-N-(2-hydroxyethyl)-3-aminopropionate,
methyl N-(2-acetoxyethyl)-N-(2-cyanoethyl)-3-aminopropionate,
N-(2-cyanoethyl)-N-ethyl-3-aminopropiononitrile,
N-(2-cyanoethyl)-N-(2-hydroxyethyl)-3-aminopropiononitrile,
N-(2-acetoxyethyl)-N-(2-cyanoethyl)-3-aminopropiononitrile,
N-(2-cyanoethyl)-N-(2-formyloxyethyl)-3-aminopropiononitrile,
N-(2-cyanoethyl)-N-(2-methoxyethyl)-3-aminopropiononitrile,
N-(2-cyanoethyl)-N-[2-(methoxymethoxy)ethyl]-3-aminopropiononitrile,
N-(2-cyanoethyl)-N-(3-hydroxy-1-propyl)-3-aminopropiononitrile,
N-(3-acetoxy-1-propyl)-N-(2-cyanoethyl)-3-aminopropiononitrile,
N-(2-cyanoethyl)-N-(3-formyloxy-1-propyl)-3-aminopropiononitrile,
N-(2-cyanoethyl)-N-tetrahydrofurfuryl-3-aminopropiononitrile,
N,N-bis(2-cyanoethyl)-3-aminopropiononitrile, diethylaminoacetonitrile,
N,N-bis(2-hydroxyethyl)aminoacetonitrile,
N,N-bis(2-acetoxyethyl)aminoacetonitrile,
N,N-bis(2-formyloxyethyl)aminoacetonitrile,
N,N-bis(2-methoxyethyl)aminoacetonitrile,
N,N-bis[2-(methoxymethoxy)ethyl]aminoacetonitrile,
methyl N-cyanomethyl-N-(2-methoxyethyl)-3-aminopropionate,
methyl N-cyanomethyl-N-(2-hydroxyethyl)-3-aminopropionate,
methyl N-(2-acetoxyethyl)-N-cyanomethyl-3-aminopropionate,
N-cyanomethyl-N-(2-hydroxyethyl)aminoacetonitrile,
N-(2-acetoxyethyl)-N-(cyanomethyl)aminoacetonitrile,
N-cyanomethyl-N-(2-formyloxyethyl)aminoacetonitrile,
N-cyanomethyl-N-(2-methoxyethyl)aminoacetonitrile,
N-cyanomethyl-N-[2-(methoxymethoxy)ethyl)aminoacetonitrile,
N-cyanomethyl-N-(3-hydroxy-1-propyl)aminoacetonitrile,
N-(3-acetoxy-1-propyl)-N-(cyanomethyl)aminoacetonitrile,
N-cyanomethyl-N-(3-formyloxy-1-propyl)aminoacetonitrile,
N,N-bis(cyanomethyl)aminoacetonitrile,
1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile,
cyanomethyl 3-diethylaminopropionate,
cyanomethyl N,N-bis(2-hydroxyethyl)-3-aminopropionate,
cyanomethyl N,N-bis(2-acetoxyethyl)-3-aminopropionate,
cyanomethyl N,N-bis(2-formyloxyethyl)-3-aminopropionate,
cyanomethyl N,N-bis(2-methoxyethyl)-3-aminopropionate,
cyanomethyl N,N-bis[2-(methoxymethoxy)ethyl]-3-aminopropionate,
2-cyanoethyl 3-diethylaminopropionate,
2-cyanoethyl N,N-bis(2-hydroxyethyl)-3-aminopropionate,
2-cyanoethyl N,N-bis(2-acetoxyethyl)-3-aminopropionate,
2-cyanoethyl N,N-bis(2-formyloxyethyl)-3-aminopropionate,
2-cyanoethyl N,N-bis(2-methoxyethyl)-3-aminopropionate,
2-cyanoethyl N,N-bis[2-(methoxymethoxy)ethyl]-3-aminopropionate,
cyanomethyl 1-pyrrolidinepropionate,
cyanomethyl 1-piperidinepropionate,
cyanomethyl 4-morpholinepropionate,
2-cyanoethyl 1-pyrrolidinepropionate,
2-cyanoethyl 1-piperidinepropionate, and
2-cyanoethyl 4-morpholinepropionate.

Also included are organic nitrogen-containing compounds having an imidazole structure and a polar functional group, represented by the general formula (B)-7.

(B)-7

Herein, $R^{310}$ is a straight, branched or cyclic alkyl group of 2 to 20 carbon atoms bearing at least one polar functional group selected from among hydroxyl, carbonyl, ester, ether, sulfide, carbonate, cyano and acetal groups; $R^{311}$, $R^{312}$ and $R^{313}$ are each independently a hydrogen atom, a straight, branched or cyclic alkyl group, aryl group or aralkyl group having 1 to 10 carbon atoms.

Also included are organic nitrogen-containing compounds having a benzimidazole structure and a polar functional group, represented by the general formula (B)-8.

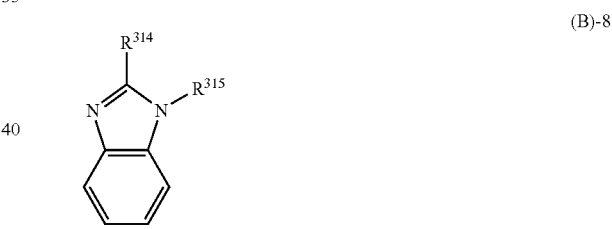

(B)-8

Herein, $R^{314}$ is a hydrogen atom, a straight, branched or cyclic alkyl group, aryl group or aralkyl group having 1 to 10 carbon atoms. $R^{315}$ is a polar functional group-bearing, straight, branched or cyclic alkyl group of 1 to 20 carbon atoms, and the alkyl group contains as the polar functional group at least one group selected from among ester, acetal and cyano groups, and may additionally contain at least one group selected from among hydroxyl, carbonyl, ether, sulfide and carbonate groups.

Further included are heterocyclic nitrogen-containing compounds having a polar functional group, represented by the general formulae (B)-9 and (B)-10.

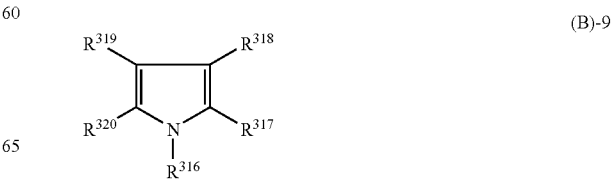

(B)-9

-continued

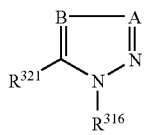
(B)-10

Herein, A is a nitrogen atom or =C—$R^{322}$, B is a nitrogen atom or =C—$R^{323}$, $R^{316}$ is a straight, branched or cyclic alkyl group of 2 to 20 carbon atoms bearing at least one polar functional group selected from among hydroxyl, carbonyl, ester, ether, sulfide, carbonate, cyano and acetal groups; $R^{317}$, $R^{318}$, $R^{319}$ and $R^{320}$ are each independently a hydrogen atom, a straight, branched or cyclic alkyl group or aryl group having 1 to 10 carbon atoms, or a pair of $R^{317}$ and $R^{318}$ and a pair of $R^{319}$ and $R^{320}$, taken together, may form a benzene, naphthalene or pyridine ring; $R^{321}$ is a hydrogen atom, a straight, branched or cyclic alkyl group or aryl group having 1 to 10 carbon atoms; $R^{322}$ and $R^{323}$ each are a hydrogen atom, a straight, branched or cyclic alkyl group or aryl group having 1 to 10 carbon atoms, or a pair of $R^{321}$ and $R^{323}$, taken together, may form a benzene or naphthalene ring.

Also included are organic nitrogen-containing compounds of aromatic carboxylic ester structure having the general formulae (B)-11 to (B)-14.

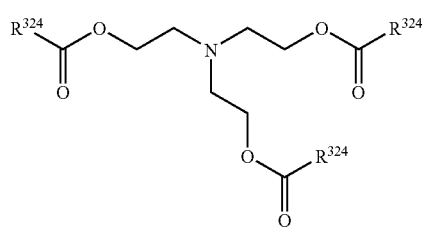
(B)-11

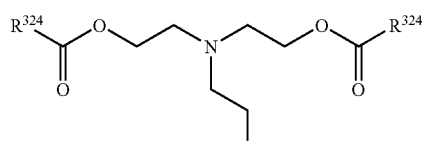
(B)-12

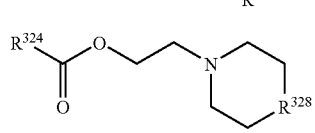
(B)-13

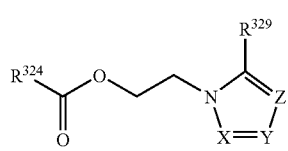
(B)-14

Herein $R^{324}$ is a $C_6$-$C_{20}$ aryl group or $C_4$-$C_{20}$ hetero-aromatic group, in which some or all of hydrogen atoms may be replaced by halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups. $R^{325}$ is $CO_2R^{326}$, $OR^{327}$ or cyano group. $R^{326}$ is a $C_1$-$C_{10}$ alkyl group, in which some methylene groups may be replaced by oxygen atoms. $R^{327}$ is a $C_1$-$C_{10}$ alkyl or acyl group, in which some methylene groups may be replaced by oxygen atoms. $R^{328}$ is a single bond, methylene, ethylene, sulfur atom or —O(CH$_2$CH$_2$O)$_m$— group wherein m is 0, 1, 2, 3 or 4. $R^{329}$ is hydrogen, methyl, ethyl or phenyl. X is a nitrogen atom or CR$^{330}$. Y is a nitrogen atom or CR$^{331}$. Z is a nitrogen atom or CR$^{332}$. $R^{330}$, $R^{331}$ and $R^{332}$ are each independently hydrogen, methyl or phenyl. Alternatively, a pair of $R^{330}$ and $R^{331}$ or a pair of $R^{331}$ and $R^{332}$ may bond together to form a $C_6$-$C_{20}$ aromatic ring or $C_2$-$C_{20}$ hetero-aromatic ring.

Further included are organic nitrogen-containing compounds of 7-oxanorbornane-2-carboxylic ester structure having the general formula (B)-15.

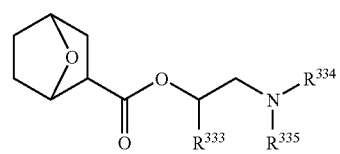
(B)-15

Herein $R^{333}$ is hydrogen or a straight, branched or cyclic $C_1$-$C_{10}$ alkyl group. $R^{334}$ and $R^{335}$ are each independently a $C_1$-$C_{20}$ alkyl group, $C_6$-$C_{20}$ aryl group or $C_7$-$C_{20}$ aralkyl group, which may contain one or more polar functional groups selected from among ether, carbonyl, ester, alcohol, sulfide, nitrile, amine, imine, and amide and in which some hydrogen atoms may be replaced by halogen atoms. $R^{334}$ and $R^{335}$, taken together, may form a heterocyclic or hetero-aromatic ring of 2 to 20 carbon atoms.

The organic nitrogen-containing compounds may be used alone or in admixture of two or more. The organic nitrogen-containing compound is preferably formulated in an amount of 0.001 to 2 parts, and especially 0.01 to 1 part by weight, per 100 parts by weight of the entire base resin. Less than 0.001 part of the nitrogen-containing compound achieves no or little addition effect whereas more than 2 parts would result in too low a sensitivity.

Other Components

In the resist composition, a compound having a group =C—COOH in a molecule may be blended. Exemplary, non-limiting compounds having a group =C—COOH include one or more compounds selected from Groups I and II below. Including this compound improves the PED stability of the resist and ameliorates edge roughness on nitride film substrates.

Group I:

Compounds in which some or all of the hydrogen atoms on the phenolic hydroxyl groups of the compounds of general formulas (A1) to (A10) below are replaced by —$R^{401}$—COOH (wherein $R^{401}$ is a straight or branched alkylene of 1 to 10 carbon atoms), and in which the molar ratio C/(C+D) of phenolic hydroxyl groups (C) to =C—COOH groups (D) in the molecule is from 0.1 to 1.0.

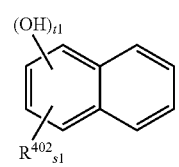
(A1)

-continued

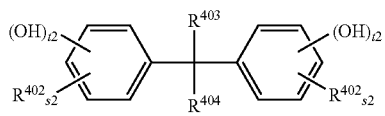
(A2)

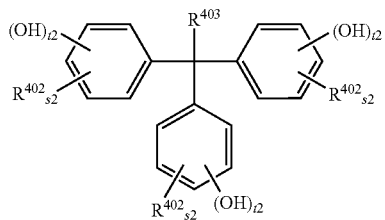
(A3)

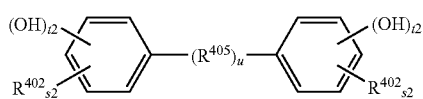
(A4)

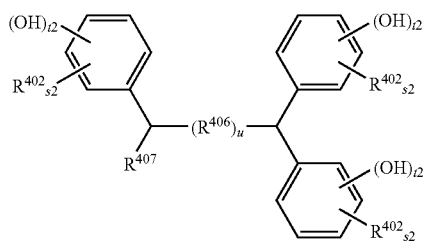
(A5)

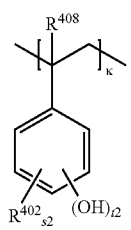
(A6)

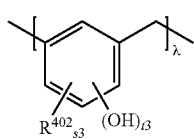
(A7)

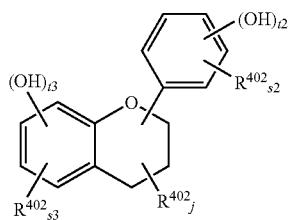
(A8)

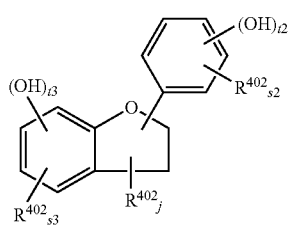
(A9)

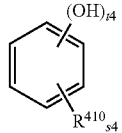
(A10)

In these formulas, $R^{408}$ is hydrogen or methyl; $R^{402}$ and $R^{403}$ are each hydrogen or a straight or branched $C_1$-$C_8$ alkyl or alkenyl; $R^{404}$ is hydrogen, a straight or branched $C_1$-$C_8$ alkyl or alkenyl, or a —$(R^{409})_h$—COOR' group (R' being hydrogen or —$R^{409}$—COOH); $R^{405}$ is —$(CH_2)_i$— (wherein i is 2 to 10), a $C_6$-$C_{10}$—arylene, carbonyl, sulfonyl, an oxygen atom, or a sulfur atom; $R^{406}$ is a $C_1$-$C_{10}$ alkylene, a $C_6$-$C_{10}$ arylene, carbonyl, sulfonyl, an oxygen atom, or a sulfur atom; $R^{407}$ is hydrogen, a straight or branched $C_1$-$C_8$ alkyl or alkenyl, or a hydroxyl-substituted phenyl or naphthyl; $R^{409}$ is a straight or branched $C_1$-$C_{10}$ alkylene; $R^{410}$ is hydrogen, a straight or branched $C_1$-$C_8$ alkyl or alkenyl, or a —$R^{411}$—COOH group; $R^{411}$ is a straight or branched $C_1$-$C_{10}$ alkylene; the letter j is an integer from 0 to 3; u is 1 to 4; s1, t1, s2, t2, s3, t3, s4, and t4 are each numbers which satisfy s1+t1=8, s2+t2=5, s3+t3=4, and s4+t4=6, and are such that each phenyl structure has at least one hydroxyl group; κ is a number such that the compound of formula (A6) may have a weight average molecular weight of 1,000 to 5,000; and λ is a number such that the compound of formula (A7) may have a weight average molecular weight of 1,000 to 10,000.

Group II:
Compounds of general formulas (A11) to (A15) below.

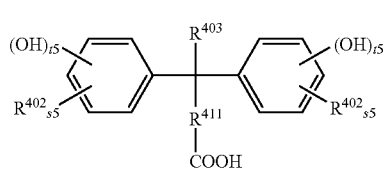
(A11)

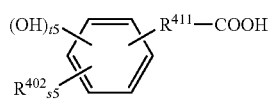
(A12)

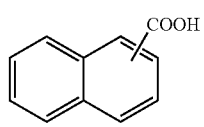
(A13)

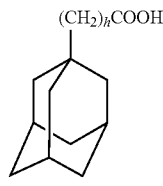
(A14)

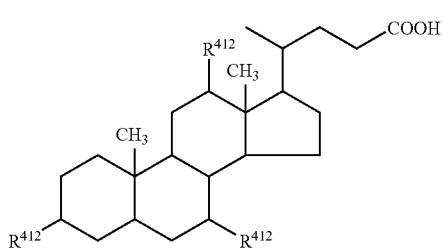 (A15)
In these formulas, $R^{402}$, $R^{403}$, and $R^{411}$ are as defined above; $R^{412}$ is hydrogen or hydroxyl; s5 and t5 are numbers which satisfy $s5 \geqq 0$, $t5 \geqq 0$, and $s5+t5=5$; and h is 1 to 4.
Illustrative, non-limiting examples of the compound having a carboxyl group include compounds of the general formulas AI-1 to AI-14 and AII-1 to AII-10 below.
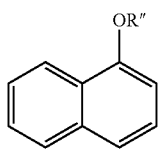 (AI-1)
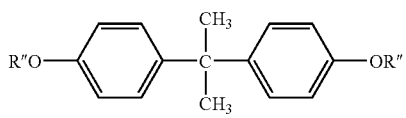 (AI-2)
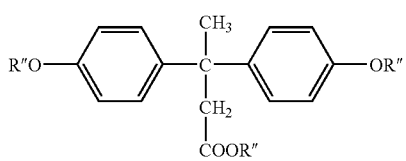 (AI-3)
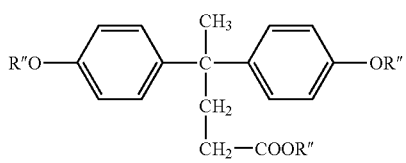 (AI-4)
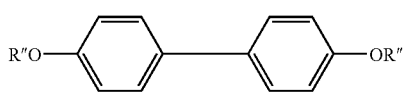 (AI-5)
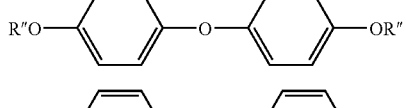 (AI-6)
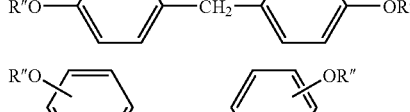 (AI-7)
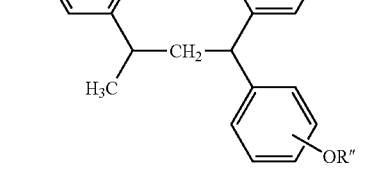 (AI-8)
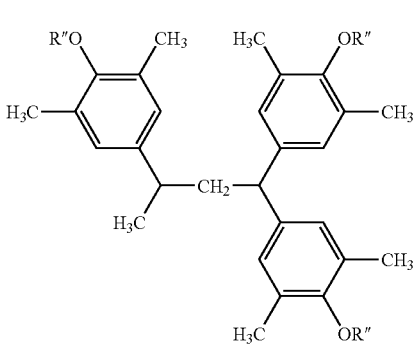 (AI-9)
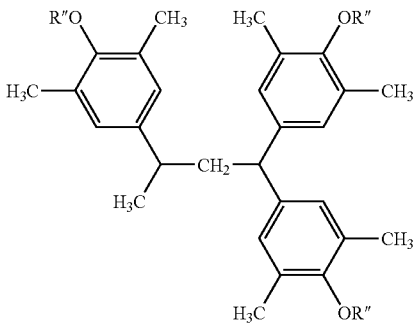 (AI-10)
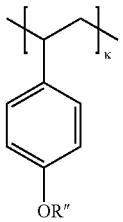 (AI-11)
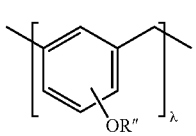 (AI-12)
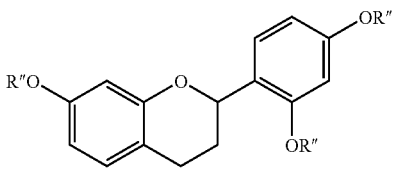 (AI-13)
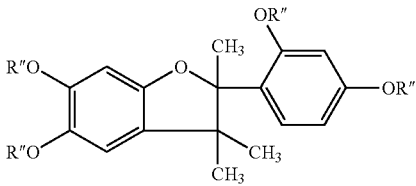 (AI-14)
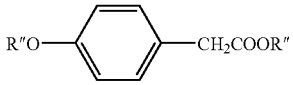 (AII-1)
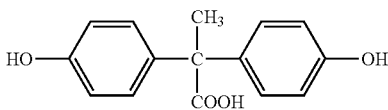 (AII-2)
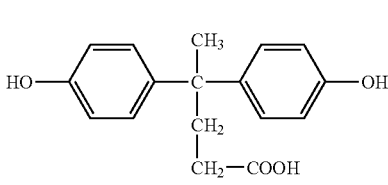 (AII-3)
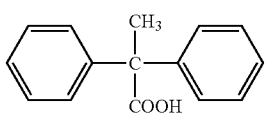

-continued

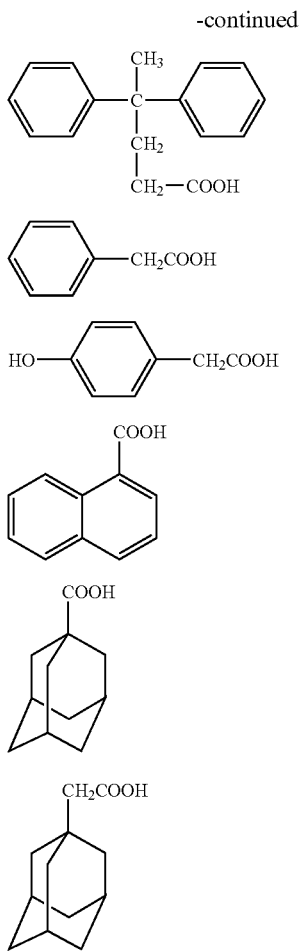

(AII-4)
(AII-5)
(AII-6)
(AII-7)
(AII-8)
(AII-9)
(AII-10)

In the above formulas, R" is hydrogen or a —CH$_2$COOH group such that the —CH$_2$COOH group accounts for 10 to 100 mol % of R" in each compound, κ and λ are as defined above.

The compound having a ≡C—COOH group may be used singly or as combinations of two or more thereof. The compound having a ≡C—COOH group is added in an amount ranging from 0 to 5 parts, preferably 0.1 to 5 parts, more preferably 0.1 to 3 parts, further preferably 0.1 to 2 parts by weight, per 100 parts by weight of the base resin. More than 5 parts of the compound can reduce the resolution of the resist composition.

The resist composition of the invention may additionally include an acetylene alcohol derivative for the purpose of enhancing the shelf stability. Preferred acetylene alcohol derivatives are those having the general formula (S1) or (S2) below.

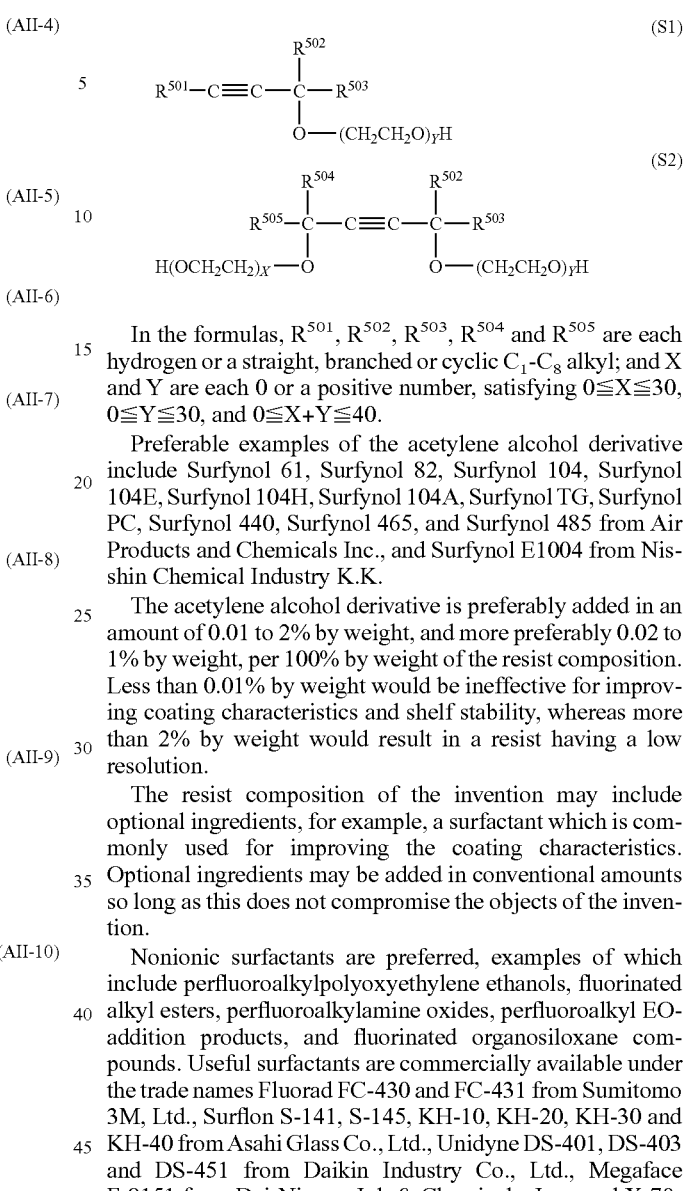

In the formulas, $R^{501}$, $R^{502}$, $R^{503}$, $R^{504}$ and $R^{505}$ are each hydrogen or a straight, branched or cyclic $C_1$-$C_8$ alkyl; and X and Y are each 0 or a positive number, satisfying $0 \leq X \leq 30$, $0 \leq Y \leq 30$, and $0 \leq X+Y \leq 40$.

Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Surfynol E1004 from Nisshin Chemical Industry K.K.

The acetylene alcohol derivative is preferably added in an amount of 0.01 to 2% by weight, and more preferably 0.02 to 1% by weight, per 100% by weight of the resist composition. Less than 0.01% by weight would be ineffective for improving coating characteristics and shelf stability, whereas more than 2% by weight would result in a resist having a low resolution.

The resist composition of the invention may include optional ingredients, for example, a surfactant which is commonly used for improving the coating characteristics. Optional ingredients may be added in conventional amounts so long as this does not compromise the objects of the invention.

Nonionic surfactants are preferred, examples of which include perfluoroalkylpolyoxyethylene ethanols, fluorinated alkyl esters, perfluoroalkylamine oxides, perfluoroalkyl EO-addition products, and fluorinated organosiloxane compounds. Useful surfactants are commercially available under the trade names Fluorad FC-430 and FC-431 from Sumitomo 3M, Ltd., Surflon S-141, S-145, KH-10, KH-20, KH-30 and KH-40 from Asahi Glass Co., Ltd., Unidyne DS-401, DS-403 and DS-451 from Daikin Industry Co., Ltd., Megaface F-8151 from Dai-Nippon Ink & Chemicals, Inc., and X-70-092 and X-70-093 from Shin-Etsu Chemical Co., Ltd. Preferred surfactants are Fluorad FC-430 from Sumitomo 3M, Ltd., KH-20 and KH-30 from Asahi Glass Co., Ltd., and X-70-093 from Shin-Etsu Chemical Co., Ltd.

Pattern formation using the resist composition of the invention may be carried out by a known lithographic technique. For example, the resist composition is applied onto a substrate such as a silicon wafer by spin coating or the like to form a resist film having a thickness of 0.1 to 2.0 μm, which is then pre-baked on a hot plate at 60 to 150° C. for 1 to 10 minutes, and preferably at 80 to 130° C. for 1 to 5 minutes. A patterning mask having the desired pattern is then placed over the resist film, and the film exposed through the mask to an electron beam or to high-energy radiation such as deep-UV rays, an excimer laser, or x-rays in a dose of about 1 to 200 mJ/cm$^2$, and preferably about 5 to 100 mJ/cm$^2$. Light exposure may be done by a conventional exposure process or in some cases, by an immersion process of providing liquid impregnation between the mask and the resist. The resist film is then post-exposure baked (PEB) on a hot plate at 60 to 150°

C. for 1 to 5 minutes, and preferably at 80 to 130° C. for 1 to 3 minutes. Finally, development is carried out using as the developer an aqueous alkali solution, such as a 0.1 to 5 wt % (preferably 2 to 3 wt %) aqueous solution of tetramethylammonium hydroxide (TMAH), this being done by a conventional method such as dip, puddle, or spray development for a period of 0.1 to 3 minutes, and preferably 0.5 to 2 minutes. These steps result in the formation of the desired pattern on the substrate. Of the various types of high-energy radiation that may be used, the resist composition of the invention is best suited to fine pattern formation with, in particular, deep-UV rays having a wavelength of 248 to 193 nm, an excimer laser, x-rays, or an electron beam. The desired pattern may not be obtainable outside the upper and lower limits of the above range.

Example

Synthesis Examples and Examples are given below by way of illustration and not by way of limitation. The abbreviation Mw is a weight average molecular weight as measured by GPC using polystyrene standards, and the polydispersity is calculated therefrom.

Polymers within the scope of the invention were synthesized by the following procedure.

Synthesis Example 1

Synthesis of Polymer 1

In 350 g of propylene glycol methyl ether acetate (PGMEA) were dissolved 31.9 g of (2-adamantyloxy)methyl methacrylate, 25.1 g of 3-hydroxy-1-adamantyl methacrylate, 42.9 g of 4,8-dioxa-5-oxotricyclo[4.2.1.0$^{3,7}$]nonan-2-yl methacrylate, and 3.49 g of 2,2'-azobisisobutyronitrile. Under a nitrogen atmosphere, this solution was added dropwise over 4 hours to 100 g of PGMEA which was heated at 800° C. At the end of dropwise addition, the solution was heated and stirred at 80° C. for 2 hours under the nitrogen atmosphere. After the completion of reaction, the reaction solution was cooled to room temperature, and with vigorous stirring, added dropwise to 2.3 L of hexane. The resulting solids were collected by filtration and dried under vacuum at 50° C. for 15 hours, obtaining 81.7 g (yield 81.7%) of a white solid. By GPC and $^{13}$C-NMR analysis, it was identified to be Polymer 1 having the composition, Mw and polydispersity shown in Table 1.

Synthesis Examples 2-25

Synthesis of Polymers 2-25

Polymers 2 to 25 were synthesized by the same procedure as above except that the type and proportion of monomers were changed, with their compositions and properties being shown in Table 1. The structure of the monomers in Table 1 is shown in Table 2.

TABLE 1

|  | Unit 1 (ratio) | Unit 2 (ratio) | Unit 3 (ratio) | Unit 4 (ratio) | Unit 5 (ratio) | Mw | Dispersity |
|---|---|---|---|---|---|---|---|
| Polymer 1 | A-1 (0.30) | C-1 (0.25) | D-1 (0.45) | — | — | 7,800 | 2.1 |
| Polymer 2 | A-1 (0.40) | C-1 (0.25) | D-1 (0.35) | — | — | 7,600 | 2.0 |
| Polymer 3 | A-1 (0.50) | C-1 (0.25) | D-1 (0.25) | — | — | 7,900 | 1.9 |
| Polymer 4 | A-1 (0.40) | C-1 (0.25) | D-2 (0.35) | — | — | 7,500 | 1.9 |
| Polymer 5 | A-1 (0.25) | A-3 (0.15) | C-1 (0.25) | D-1 (0.35) | — | 7,600 | 1.9 |
| Polymer 6 | A-1 (0.25) | A-3 (0.25) | C-1 (0.25) | D-1 (0.25) | — | 7,500 | 1.9 |
| Polymer 7 | A-1 (0.25) | A-4 (0.15) | C-1 (0.25) | D-1 (0.35) | — | 7,300 | 1.9 |
| Polymer 8 | A-1 (0.25) | A-5 (0.15) | C-1 (0.25) | D-1 (0.35) | — | 7,500 | 1.9 |
| Polymer 9 | A-1 (0.30) | B-1 (0.10) | C-1 (0.25) | D-1 (0.35) | — | 7,300 | 2.3 |
| Polymer 10 | A-1 (0.30) | B-2 (0.10) | C-1 (0.25) | D-1 (0.35) | — | 7,900 | 1.9 |
| Polymer 11 | A-1 (0.30) | B-3 (0.10) | C-1 (0.25) | D-1 (0.35) | — | 7,700 | 1.9 |
| Polymer 12 | A-1 (0.25) | A-3 (0.10) | B-1 (0.05) | C-1 (0.25) | D-1 (0.35) | 7,700 | 2.2 |
| Polymer 13 | A-1 (0.25) | A-3 (0.10) | B-2 (0.05) | C-1 (0.25) | D-1 (0.35) | 7,900 | 1.8 |
| Polymer 14 | A-1 (0.25) | A-4 (0.10) | B-3 (0.05) | C-1 (0.25) | D-1 (0.35) | 7,800 | 1.9 |
| Polymer 15 | A-1 (0.40) | C-2 (0.25) | D-1 (0.35) | — | — | 8,100 | 2.2 |
| Polymer 16 | A-1 (0.40) | C-1 (0.25) | D-3 (0.35) | — | — | 8,300 | 2.3 |
| Polymer 17 | A-1 (0.40) | C-2 (0.25) | D-3 (0.35) | — | — | 8,700 | 2.2 |
| Polymer 18 | A-2 (0.40) | C-2 (0.25) | D-3 (0.35) | — | — | 8,500 | 2.3 |
| Polymer 19 | A-5 (0.40) | C-1 (0.25) | D-4 (0.35) | — | — | 7,700 | 2.0 |
| Polymer 20 | A-1 (0.40) | C-1 (0.25) | D-4 (0.35) | — | — | 8,300 | 2.0 |
| Polymer 21 | A-5 (0.40) | C-1 (0.25) | D-1 (0.35) | — | — | 7,600 | 1.9 |
| Polymer 22 | A-6 (0.50) | D-1 (0.50) | — | — | — | 8,800 | 2.2 |
| Polymer 23 | A-7 (0.50) | D-1 (0.50) | — | — | — | 9,100 | 2.1 |
| Polymer 24 | A-7 (0.30) | C-1 (0.20) | D-2 (0.50) | — | — | 8,500 | 2.2 |
| Polymer 25 | A-7 (0.30) | C-3 (0.20) | D-2 (0.50) | — | — | 8,700 | 2.1 |

Note:
The ratio is a ratio in mol % of the referenced unit based on the entire units of a polymer.

TABLE 2

A-1 formula (2)

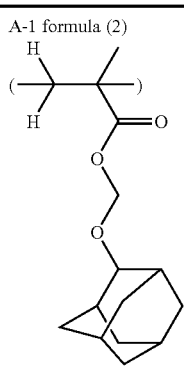

TABLE 2-continued
A-2 formula (2)
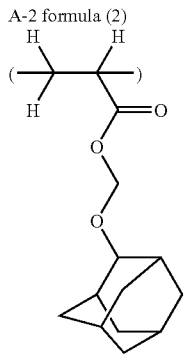
A-3 formula (4)
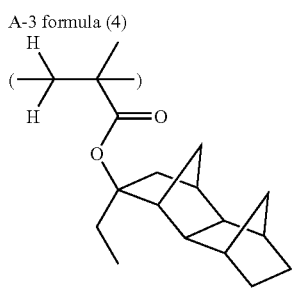
A-4 formula (4)
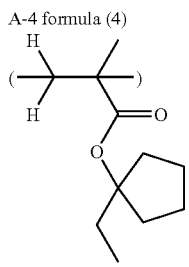
A-5 formula (4)
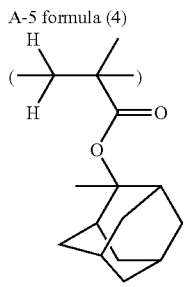
A-6 Comparative Example
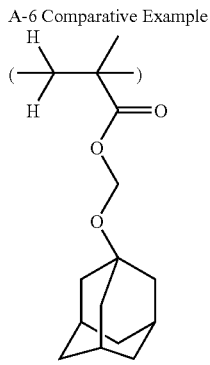
TABLE 2-continued
A-7 Comparative Example
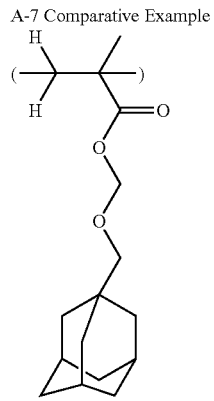
B-1 formula (5)
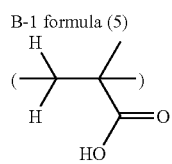
B-2 formula (6)
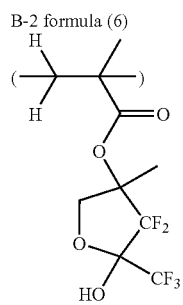
B-3 formula (6)
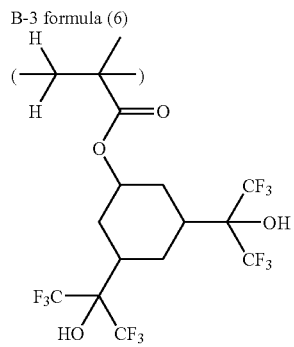
C-1 formula (3)
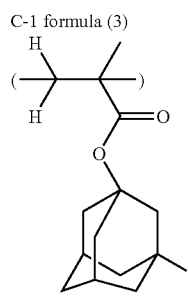

TABLE 2-continued

C-2 formula (3)
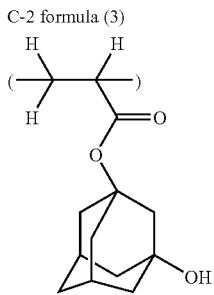

C-3 formula (3)
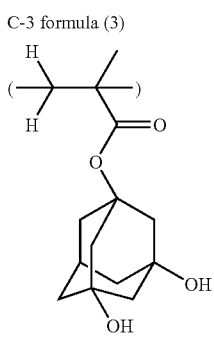

D-1 formula (1)
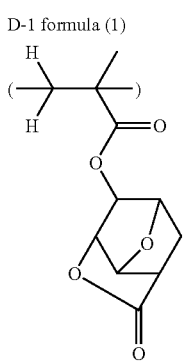

D-2 formula (1)
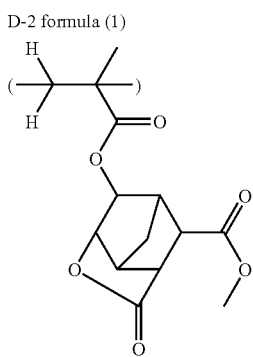

TABLE 2-continued

D-3 formula (1)
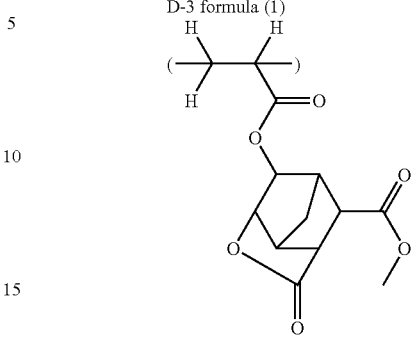

D-4 Comparative Example
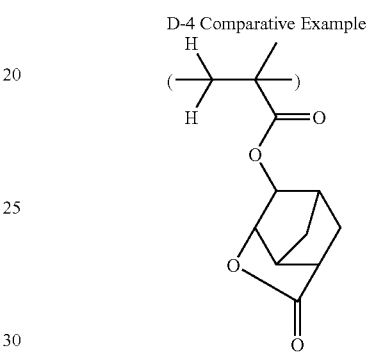

Examples 1-24 & Comparative Examples 1-7

Resist compositions were formulated using the inventive polymers as the base resin and examined for sensitivity and resolution.

Resist compositions were prepared by using inventive Polymers 1 to 18 or (comparative) Polymers 19 to 25, identified in Table 1, as the base resin, and dissolving the polymer, a photoacid generator (PAG1, 2), a dissolution inhibitor (DRR1-4), and a basic compound (Base 1) in a solvent (PGMEA) containing 0.01 wt % of surfactant KH-20 (Asahi Glass Co., Ltd.) in accordance with the recipe shown in Tables 3 and 4. These compositions were each filtered through a Teflon® filter having a pore diameter 0.2 μm, thereby giving resist solutions.

PAG1: triphenylsulfonium nonafluorobutanesulfonate

PAG2: 4-t-butylphenyldiphenylsulfonium nonafluorobutanesulfonate (DRR1)
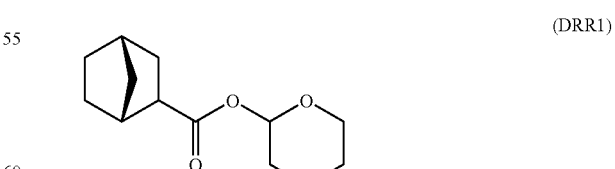

(DRR2)
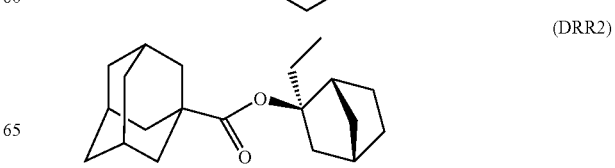

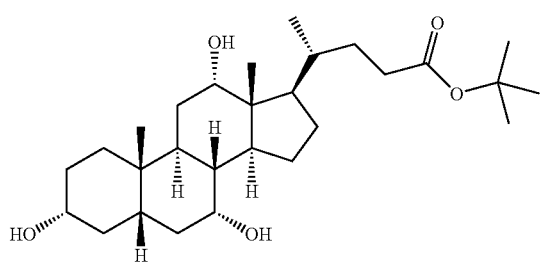
(DRR3)

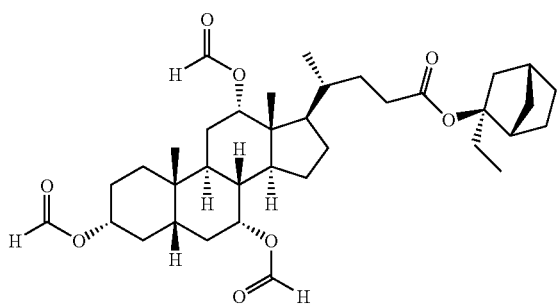
(DRR4)

Base 1: trismethoxymethoxyethylamine
PGMEA: propylene glycol methyl ether acetate Evaluation The solutions of resist compositions (Examples 1-24, Comparative Examples 1-7) thus prepared were tested by ArF (wavelength 193 nm) exposure.

First, an antireflective coating solution (ARC29A by Nissan Chemical Co., Ltd.) was coated on a silicon substrate and baked at 200° C. for 60 seconds to form an antireflective coating of 78 nm thick. Each resist solution was spin coated onto the antireflective film on the substrate and baked on a hot plate at 120° C. for 60 seconds to form a resist film of 300 nm thick. The resist film was exposed using an ArF excimer laser stepper NSR-S305B (Nikon Corporation; NA 0.68, σ0.85, 2/3 annular illumination, Cr mask), then baked (PEB) at 100° C. for 90 seconds, and developed with a solution of 2.38 wt % tetramethylammonium hydroxide in water for 30 seconds, thereby forming a positive pattern.

The optimal exposure (Eop, $mJ/cm^2$) was defined as the exposure dose which provided a 1:1 resolution at the top and bottom of a 0.12-μm group line-and-space pattern. The resolution of the resist under evaluation was defined as the minimum line width (μm) of the lines and spaces that separated at the optimal exposure. The width of an isolated line in a 1:10 line-and-space pattern at the same exposure was measured, and the grouped line width minus the isolated line width was the size difference between isolated and grouped patterns (I/G bias). The group lines were examined for roughness, which was reported as line edge roughness (LER). The results are shown in Tables 3 and 4.

TABLE 3

| | | Resin (pbw) | Photoacid generator (pbw) | Dissolution inhibitor (pbw) | Basic compound (pbw) | Solvent (pbw) | Eop ($mJ/cm^2$) | Resolution (μm) | I/G bias (nm) | LER (nm) |
|---|---|---|---|---|---|---|---|---|---|---|
| Example | 1 | Polymer 1 (80) | PAG1 (3.0) | | Base1 (0.35) | PGMEA (800) | 30 | 0.11 | 25 | 8.0 |
| | 2 | Polymer 2 (80) | PAG1 (3.0) | | Base1 (0.35) | PGMEA (800) | 25 | 0.11 | 20 | 6.0 |
| | 3 | Polymer 3 (80) | PAG1 (3.0) | | Base1 (0.35) | PGMEA (800) | 28 | 0.11 | 22 | 6.7 |
| | 4 | Polymer 4 (80) | PAG1 (3.0) | | Base1 (0.35) | PGMEA (800) | 29 | 0.11 | 22 | 7.5 |
| | 5 | Polymer 5 (80) | PAG1 (3.0) | | Base1 (0.35) | PGMEA (800) | 32 | 0.11 | 18 | 7.8 |
| | 6 | Polymer 6 (80) | PAG1 (3.0) | | Base1 (0.35) | PGMEA (800) | 20 | 0.11 | 27 | 6.3 |
| | 7 | Polymer 7 (80) | PAG1 (3.0) | | Base1 (0.35) | PGMEA (800) | 30 | 0.11 | 19 | 7.9 |
| | 8 | Polymer 8 (80) | PAG1 (3.0) | | Base1 (0.35) | PGMEA (800) | 29 | 0.11 | 25 | 7.2 |
| | 9 | Polymer 9 (80) | PAG1 (3.0) | | Base1 (0.35) | PGMEA (800) | 29 | 0.11 | 19 | 8.1 |
| | 10 | Polymer 10 (80) | PAG1 (3.0) | | Base1 (0.35) | PGMEA (800) | 30 | 0.11 | 23 | 6.9 |
| | 11 | Polymer 11 (80) | PAG1 (3.0) | | Base1 (0.35) | PGMEA (800) | 27 | 0.11 | 28 | 7.1 |
| | 12 | Polymer 12 (80) | PAG1 (3.0) | | Base1 (0.35) | PGMEA (800) | 25 | 0.11 | 20 | 7.9 |
| | 13 | Polymer 13 (80) | PAG1 (3.0) | | Base1 (0.35) | PGMEA (800) | 27 | 0.11 | 27 | 6.3 |
| | 14 | Polymer 14 (80) | PAG1 (3.0) | | Base1 (0.35) | PGMEA (800) | 27 | 0.11 | 29 | 5.9 |
| | 15 | Polymer 15 (80) | PAG1 (3.0) | | Base1 (0.35) | PGMEA (800) | 21 | 0.11 | 33 | 5.9 |
| | 16 | Polymer 16 (80) | PAG1 (3.0) | | Base1 (0.35) | PGMEA (800) | 23 | 0.12 | 36 | 5.3 |
| | 17 | Polymer 17 (80) | PAG1 (3.0) | | Base1 (0.35) | PGMEA (800) | 24 | 0.12 | 38 | 5.4 |
| | 18 | Polymer 18 (80) | PAG1 (3.0) | | Base1 (0.35) | PGMEA (800) | 27 | 0.12 | 41 | 5.3 |

TABLE 3-continued

| | | Resin (pbw) | Photoacid generator (pbw) | Dissolution inhibitor (pbw) | Basic compound (pbw) | Solvent (pbw) | Eop (mJ/cm$^2$) | Resolution (μm) | I/G bias (nm) | LER (nm) |
|---|---|---|---|---|---|---|---|---|---|---|
| | 19 | Polymer 1 (80) | PAG2 (3.0) | | Base1 (0.35) | PGMEA (800) | 34 | 0.11 | 26 | 6.6 |
| | 20 | Polymer 2 (80) | PAG2 (3.0) | | Base1 (0.35) | PGMEA (800) | 30 | 0.11 | 18 | 8.0 |
| | 21 | Polymer 1 (80) | PAG1 (3.0) | DRR1 | Base1 (0.35) | PGMEA (800) | 31 | 0.10 | 22 | 7.5 |
| | 22 | Polymer 1 (80) | PAG1 (3.0) | DRR2 | Base1 (0.35) | PGMEA (800) | 36 | 0.10 | 21 | 7.8 |
| | 23 | Polymer 1 (80) | PAG1 (3.0) | DRR3 | Base1 (0.35) | PGMEA (800) | 33 | 0.11 | 23 | 7.5 |
| | 24 | Polymer 1 (80) | PAG1 (3.0) | DRR4 | Base1 (0.35) | PGMEA (800) | 31 | 0.10 | 27 | 7.1 |

TABLE 4

| | | Resin (pbw) | Photoacid generator (pbw) | Dissolution inhibitor (pbw) | Basic compound (pbw) | Solvent (pbw) | Eop (mJ/cm$^2$) | Resolution (μm) | I/G bias (nm) | LER (nm) |
|---|---|---|---|---|---|---|---|---|---|---|
| Comparative Example | 1 | Polymer 19 (80) | PAG1 (3.0) | | Base1 (0.35) | PGMEA (800) | 34 | 0.12 | 25 | 14.3 |
| | 2 | Polymer 20 (80) | PAG1 (3.0) | | Base1 (0.35) | PGMEA (800) | 33 | 0.11 | 44 | 8.2 |
| | 3 | Polymer 21 (80) | PAG1 (3.0) | | Base1 (0.35) | PGMEA (800) | 40 | 0.12 | 36 | 10.1 |
| | 4 | Polymer 22 (80) | PAG1 (3.0) | | Base1 (0.35) | PGMEA (800) | 25 | 0.13 | 40 | 13.5 |
| | 5 | Polymer 23 (80) | PAG1 (3.0) | | Base1 (0.35) | PGMEA (800) | 21 | 0.13 | 43 | 15.7 |
| | 6 | Polymer 24 (80) | PAG1 (3.0) | | Base1 (0.35) | PGMEA (800) | 31 | 0.12 | 37 | 10.8 |
| | 7 | Polymer 25 (80) | PAG1 (3.0) | | Base1 (0.35) | PGMEA (800) | 35 | 0.12 | 30 | 9.9 |

It is evident from Tables 3 and 4 that the resist compositions within the scope of the invention have a higher resolution than the prior art resist compositions and are improved in both LER and I/G bias.

All the aforementioned patent publications are incorporated herein by reference.

Japanese Patent Application No. 2005-374831 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A polymer comprising recurring units having the general formulas (1), (2), (3), (4), (5), and (6), shown below, in amounts of 1 to 60 mol % of units (1), 1 to 60 mol % of units (2), 1 to 50 mol % of units (3), 0 to 60 mol % of units (4), 0 to 30 mol % of units (5), and 3 to 30 mol % of units (6), said polymer having a weight average molecular weight of 3,000 to 30,000 and a dispersity of 1.5 to 2.5,

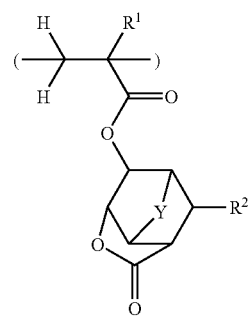
(1)

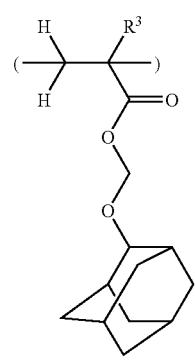
(2)

-continued

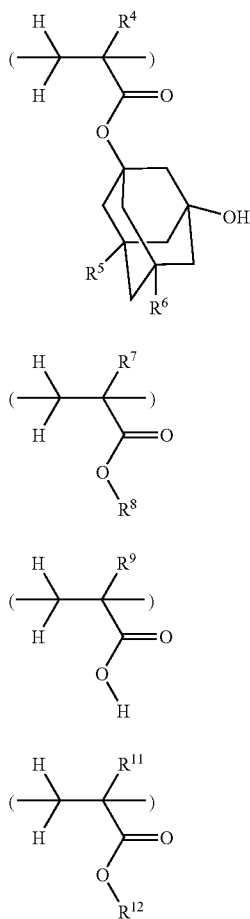

(3)

(4)

(5)

(6)

wherein $R^1$, $R^3$, $R^4$, $R^7$, $R^9$, and $R^{11}$ are each independently hydrogen or methyl, Y is methylene or an oxygen atom, $R^2$ is $CO_2R^{10}$ when Y is methylene and $R^2$ is hydrogen or $CO_2R^{10}$ when Y is an oxygen atom, $R^{10}$ is a straight, branched or cyclic alkyl group of 1 to 15 carbon atoms or a similar alkyl group in which at least one oxygen atom intervenes in an arbitrary carbon-to-carbon bond thereof, $R^5$ and $R^6$ are each independently hydrogen or a hydroxyl group, $R^8$ is a tertiary ester type acid-labile protective group selected from the general formulas ($R^8$-1) and ($R^8$-2), shown below,

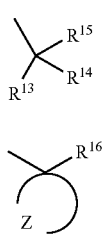

($R^8$-1)

($R^8$-2)

wherein $R^{13}$, $R^{14}$, and $R^{15}$ are each independently a straight, branched or cyclic alkyl group of 1 to 15 carbon atoms, $R^{16}$ is a straight or branched alkyl group of 1 to 15 carbon atoms, and Z is an atomic grouping which forms cyclopentane, cyclohexane, adamantane, norbornane, tricyclo[5.2.1.0$^{2,6}$]decane or tetracyclo[4.4.0.1$^{2,5}$.1$^{7,10}$]dodecane or a derivative thereof with the carbon atom to which it is bonded, and $R^{12}$ is a fluoroalkyl group containing a hydroxyl group selected from the group consisting of groups having the following formulae:

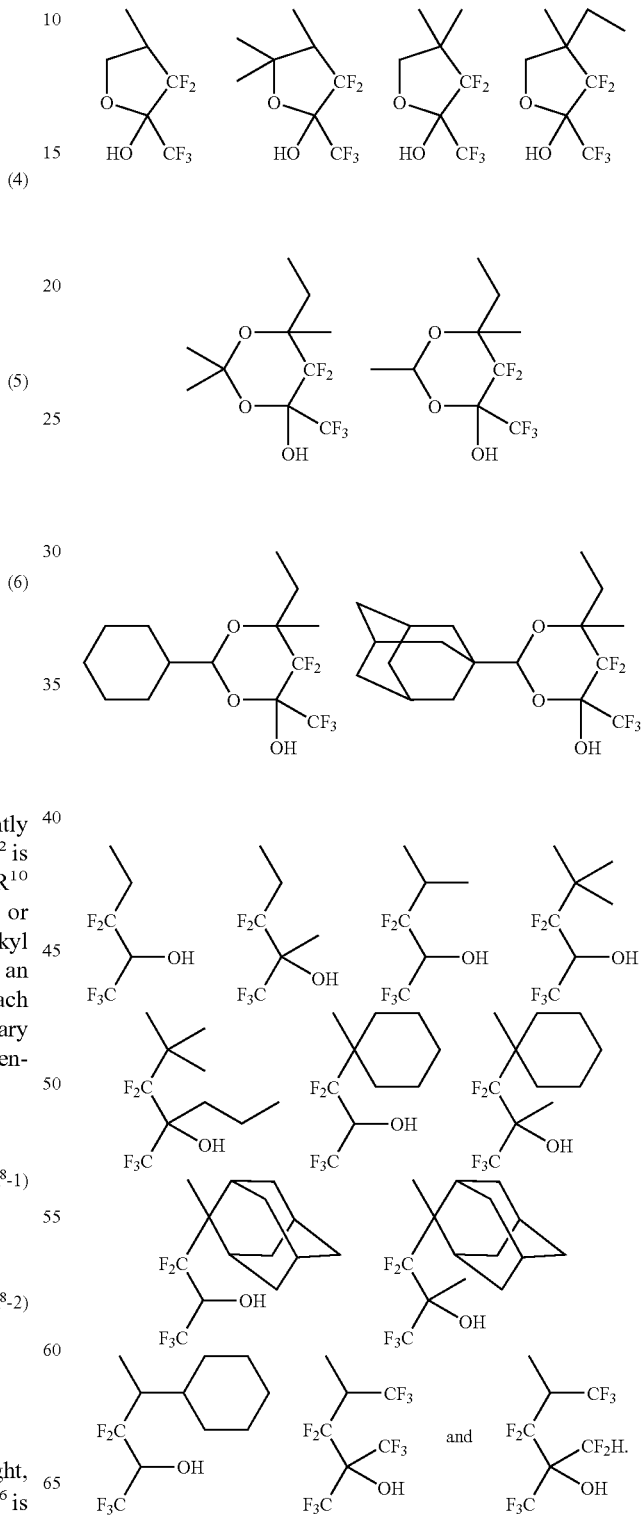

2. The polymer of claim 1, wherein the recurring units of formula (1) are recurring units having the formula (1-1) or (1-2):

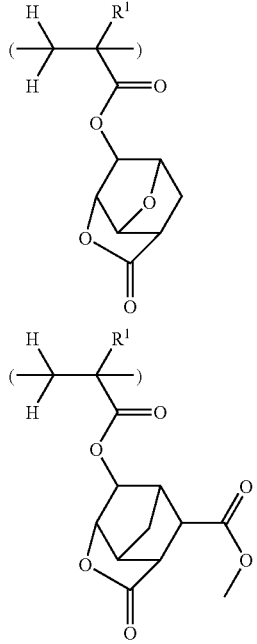

wherein $R^1$ is hydrogen or methyl.

3. The polymer of claim 1, wherein said polymer has a weight average molecular weight of 4,000 to less than 8,000 and a dispersity of 1.5 to 2.3.

4. A resist composition comprising the polymer of claim 1.

5. A process for forming a pattern comprising the steps of applying the resist composition of claim 4 onto a substrate to form a coating, heat treating the coating, exposing the coating to high-energy radiation or electron beam trough a photomask, heat treating the exposed coating and developing it with a developer.

6. The polymer of claim 1, wherein the recurring units of formula (4) are presented in an amount of 5 to 60 mol %.

7. A resist composition comprising the polymer of claim 6, and a photoacid generator.

8. The polymer of claim 1, wherein the recurring units of formula (5) are presented in an amount of 5 to 30 mol %.

9. A resist composition comprising the polymer of claim 8, and a photoacid generator.

10. The polymer of claim 1, wherein the recurring units of formula (4) are presented in an amount of 5 to 60 mol % and the recurring units of formula (5) are presented in an amount of 5 to 30 mol %.

11. A resist composition comprising the polymer of claim 10, and a photoacid generator.

12. A polymer consisting of recurring units having the general formulas (1), (2), (3), (4), and (5), shown below, in amounts of 1 to 60 mol % of units (1), 1 to 60 mol % of units (2), 1 to 50 mol % of units (3), 0 to 60 mol % of units (4), and 5 to 30 mol % of units (5), said polymer having a weight average molecular weight of 3,000 to 30,000 and a dispersity of 1.5 to 2.5,

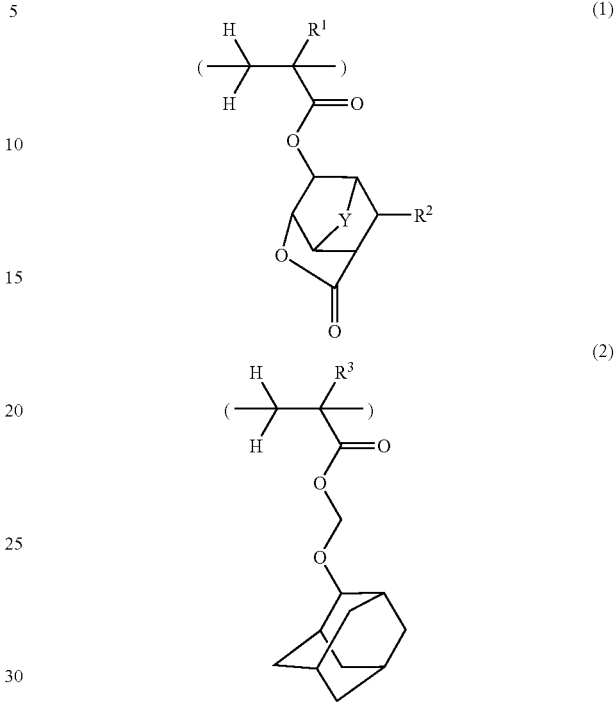

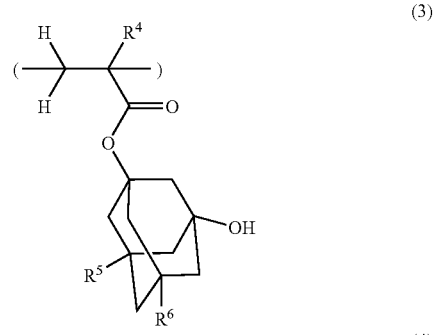

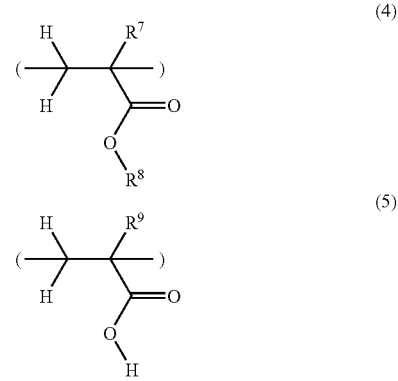

wherein $R^1$, $R^3$, $R^4$, $R^7$, and $R^9$ are each independently hydrogen or methyl, Y is methylene or an oxygen atom, $R^2$ is $CO_2R^{10}$ when Y is methylene and $R^2$ is hydrogen or $CO_2R^{10}$ when Y is an oxygen atom, $R^{10}$ is a straight, branched or cyclic alkyl group of 1 to 15 carbon atoms or a similar alkyl group in which at least one oxygen atom intervenes in an arbitrary carbon-to-carbon bond thereof, $R^5$ and $R^6$ are each independently hydrogen or a hydroxyl group, $R^8$ is a tertiary ester type acid-labile protective group selected from the general formulas (R⁸-1) and (R⁸-2), shown below,

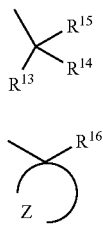

wherein $R^{13}$, $R^{14}$, and $R^{15}$ are each independently a straight, branched or cyclic alkyl group of 1 to 15 carbon atoms, $R^{16}$ is a straight or branched alkyl group of 1 to 15 carbon atoms, and Z is an atomic grouping which forms cyclopentane, cyclohexane, adamantane, norbornane, tricyclo[5.2.1.0$^{2,6}$]decane or tetracyclo[4.4.0.1$^{2,5}$.1$^{7,10}$]dodecane or a derivative thereof with the carbon atom to which it is bonded.

13. A resist composition comprising the polymer of claim 12, and n photoacid generator.

14. A polymer consisting of recurring units having the general formulas (1), (2), (3), (4), and (5), shown below, in amounts of 1 to 60 mol % of units (1), 1 to 60 mol % of units (2), 1 to 50 mol % of units (3), 5 to 60 mol % of units (4), and 5 to 30 mol % of units (5), said polymer having a weight average molecular weight of 3,000 to 30,000 and a dispersity of 1.5 to 2.5,

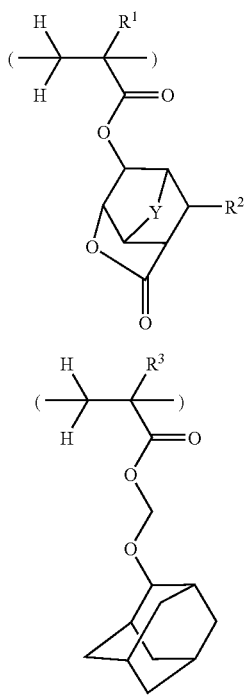

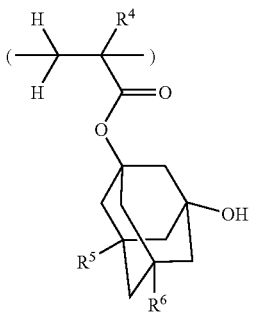

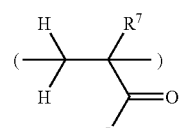

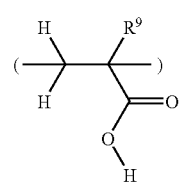

wherein $R^1$, $R^3$, $R^4$, $R^7$, and R9 are each independently hydrogen or methyl, Y is methylene or an oxygen atom, $R^2$ is $CO_2R^{10}$ when Y is methylene and $R^2$ is hydrogen or $CO_2R^{10}$ when Y is an oxygen atom, $R^{10}$ is a straight, branched or cyclic alkyl group of 1 to 15 carbon atoms or a similar alkyl group in which at least one oxygen atom intervenes in an arbitrary carbon-to-carbon bond thereof, $R^5$ and $R^6$ are each independently hydrogen or a hydroxyl group, $R^8$ is a tertiary ester type acid-labile protective group selected from the general formulas (R⁸-1) and (R⁸-2), shown below,

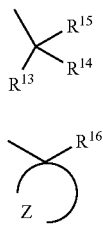

wherein $R^{13}$, $R^{14}$, and $R^{15}$ are each independently a straight, branched or cyclic alkyl group of 1 to 15 carbon atoms, $R^{16}$ is a straight or branched alkyl group of 1 to 15 carbon atoms, and Z is an atomic grouping which forms cyclopentane, cyclohexane, adamantane, norbornane, tricyclo[5.2.1.0$^{2,6}$]decane or tetracyclo[4.4.0.1$^{2,5}$.1$^{7,10}$]dodecane or a derivative thereof with the carbon atom to which it is bonded.

15. A resist composition comprising the polymer of claim 14, and a photoacid generator.

\* \* \* \* \*